United States Patent
Page et al.

(10) Patent No.: US 9,164,137 B2
(45) Date of Patent: Oct. 20, 2015

(54) TUNABLE BASELINE COMPENSATION SCHEME FOR TOUCHSCREEN CONTROLLERS

(71) Applicant: Cypress Semiconductor Corporation, San Jose, CA (US)

(72) Inventors: Andrew Page, Kirkland, WA (US); Timothy Williams, Bellevue, WA (US); Rajiv Kumar Singh, Lynnwood, WA (US); Kaveh Hosseini, Cork (IE); Jonathan Peterson, Everett, WA (US); Andriy Maharyta, Lviv (UA)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 0 days.

(21) Appl. No.: 14/317,696

(22) Filed: Jun. 27, 2014

(65) Prior Publication Data

US 2015/0162932 A1    Jun. 11, 2015

Related U.S. Application Data

(60) Provisional application No. 61/912,436, filed on Dec. 5, 2013.

(51) Int. Cl.
  *G01R 27/26* (2006.01)
  *G01R 31/02* (2006.01)
  *G06K 9/00* (2006.01)
  *G01D 5/24* (2006.01)

(52) U.S. Cl.
  CPC .............. *G01R 27/2605* (2013.01); *G01D 5/24* (2013.01); *G01R 31/028* (2013.01); *G06K 9/0002* (2013.01)

(58) Field of Classification Search
  CPC ....... G06F 3/044; G06F 3/045; G06F 3/0412; G06F 3/0416; G06F 3/046; G01R 1/203; G01R 27/02; G01R 27/2605; G01R 31/028; G01D 18/00; G01D 5/2405; G01D 5/24; G06K 9/0002; G01N 27/223; G01N 27/22; G01B 7/087; G01B 7/125; G01B 7/003; H03K 17/962; G01L 9/12; G01C 19/5719
  USPC .................. 324/658, 669, 684, 686, 720, 174
  See application file for complete search history.

(56) References Cited

U.S. PATENT DOCUMENTS

| | | | |
|---|---|---|---|
| 6,949,937 B2 * | 9/2005 | Knoedgen | 324/658 |
| 7,545,153 B2 * | 6/2009 | Abe | 324/663 |
| 8,248,084 B2 * | 8/2012 | Bokma et al. | 324/658 |
| 8,319,505 B1 * | 11/2012 | Maharyta | 324/658 |
| 8,358,142 B2 * | 1/2013 | Maharyta | 324/658 |
| 8,570,052 B1 * | 10/2013 | Mahartya | 324/658 |
| 8,605,037 B2 * | 12/2013 | Philipp et al. | 345/173 |
| 8,664,548 B2 * | 3/2014 | Wilson et al. | 178/18.01 |
| 8,692,563 B1 * | 4/2014 | Maharyta | 324/658 |
| 8,743,081 B2 * | 6/2014 | Kuang | 345/174 |
| 2005/0134292 A1 * | 6/2005 | Knoedgen | 324/658 |
| 2006/0250142 A1 * | 11/2006 | Abe | 324/663 |
| 2009/0032312 A1 * | 2/2009 | Huang et al. | 178/18.06 |
| 2009/0303198 A1 * | 12/2009 | Yilmaz et al. | 345/173 |
| 2009/0303203 A1 * | 12/2009 | Yilmaz et al. | 345/174 |
| 2010/0051354 A1 * | 3/2010 | Ningrat et al. | 178/18.06 |

(Continued)

*Primary Examiner* — Patrick Assouad
(74) *Attorney, Agent, or Firm* — Morgan, Lewis & Bockius LLP

(57) ABSTRACT

A method for compensating for panel capacitance the associated current is proposed, wherein the mutual capacitances of a capacitance sensing array are selectively coupled to drive voltages and to a self capacitance under test.

20 Claims, 20 Drawing Sheets

(56) References Cited

U.S. PATENT DOCUMENTS

| | | | |
|---|---|---|---|
| 2010/0053097 A1* | 3/2010 | Goh et al. | 345/173 |
| 2010/0096193 A1* | 4/2010 | Yilmaz et al. | 178/18.06 |
| 2010/0097078 A1* | 4/2010 | Philipp et al. | 324/684 |
| 2010/0139991 A1* | 6/2010 | Philipp et al. | 178/18.06 |
| 2011/0061949 A1* | 3/2011 | Krah et al. | 178/18.06 |
| 2011/0109585 A1* | 5/2011 | Kwon et al. | 345/174 |
| 2011/0157077 A1* | 6/2011 | Martin et al. | 345/174 |
| 2011/0254802 A1* | 10/2011 | Philipp | 345/174 |
| 2012/0043972 A1* | 2/2012 | Jayaraman | 324/658 |
| 2012/0050206 A1* | 3/2012 | Welland | 345/174 |
| 2012/0054379 A1* | 3/2012 | Leung et al. | 710/23 |
| 2012/0062497 A1* | 3/2012 | Rebeschi et al. | 345/174 |
| 2012/0062498 A1* | 3/2012 | Weaver et al. | 345/174 |
| 2012/0062499 A1* | 3/2012 | Weaver et al. | 345/174 |
| 2012/0098786 A1* | 4/2012 | Kuang | 345/174 |
| 2012/0169659 A1* | 7/2012 | Welland | 345/174 |
| 2012/0286800 A1* | 11/2012 | Maharyta et al. | 324/603 |
| 2012/0306802 A1* | 12/2012 | McCracken | 345/174 |
| 2013/0127779 A1* | 5/2013 | Lillie et al. | 345/174 |
| 2013/0155003 A1* | 6/2013 | Kwon et al. | 345/174 |
| 2013/0257786 A1* | 10/2013 | Brown et al. | 345/174 |
| 2013/0278447 A1* | 10/2013 | Kremin | 341/20 |
| 2014/0104223 A1* | 4/2014 | Hanssen et al. | 345/174 |
| 2014/0104226 A1* | 4/2014 | Lee et al. | 345/174 |
| 2014/0132287 A1* | 5/2014 | Reynolds et al. | 324/686 |
| 2014/0176488 A1* | 6/2014 | Jo | 345/174 |
| 2014/0210764 A1* | 7/2014 | Shepelev | 345/174 |
| 2014/0327644 A1* | 11/2014 | Mohindra | 345/174 |

* cited by examiner

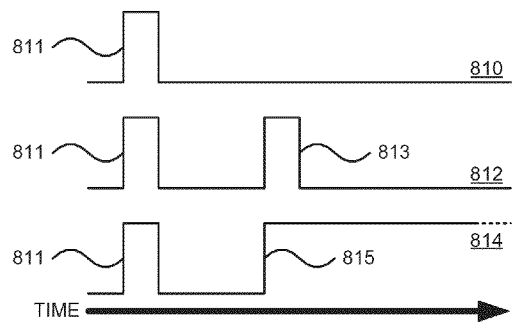
FIGURE 8A
FIGURE 8B
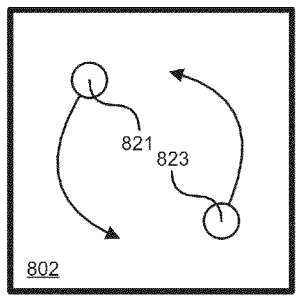
FIGURE 8C
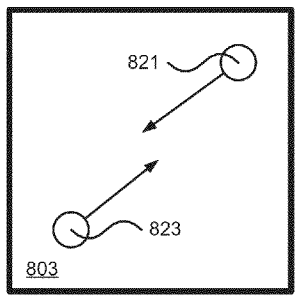
FIGURE 8D
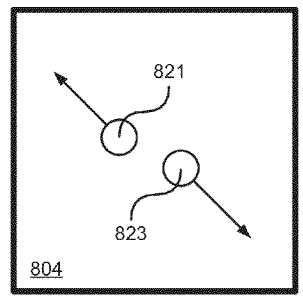
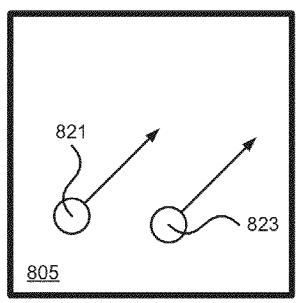
FIGURE 8E
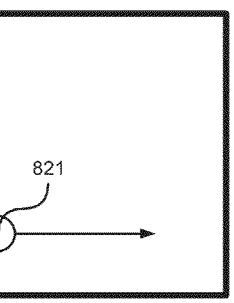
FIGURE 8F
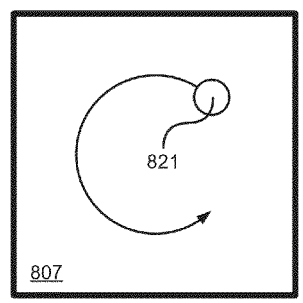
FIGURE 8G

TUNABLE BASELINE COMPENSATION SCHEME FOR TOUCHSCREEN CONTROLLERS

RELATED APPLICATION

This patent application claims the benefit of U.S. Provisional Patent Application No. 61/912,436, filed Dec. 5, 2013, which is incorporated by reference herein.

TECHNICAL FIELD

This disclosure relates generally to electronic systems, and, more particularly, to developing, programming, and debugging environment for programmable systems.

BACKGROUND

Capacitance sensing systems can sense electrical signals generated on electrodes that reflect changes in capacitance. Such changes in capacitance can indicate a touch event (e.g., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern consumer applications, providing user interface options in existing products. Capacitive sense elements can range from a single button to a large number of sensors arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a change in capacitance indicating a touch or presence of a conductive object. When a conductive object (e.g., a finger, hand, or other object) comes into contact or close proximity with a capacitive sense element or surface above a capacitive sense element, the capacitance changes and the conductive object is detected. The capacitance changes of the capacitive touch sense elements can be measured by an electrical circuit. The electrical circuit converts the capacitances of the capacitive sense elements into digital values.

SUMMARY

A capacitance sensing circuit is described that includes a first plurality of electrodes disposed along a first axis, a second plurality of electrodes disposed along a second axis such that a plurality of mutual capacitances are formed between at least one of the first plurality of electrodes and at least one of the second plurality of electrodes, wherein each of the first and second pluralities have a panel capacitance, according to one embodiment. The capacitance sensing circuit may include a conversion circuit selectively coupled to the first and second pluralities of electrodes and configured to convert a capacitance of at least one of the first plurality of electrodes or at least one of the second plurality of electrodes to a digital value, according to one embodiment. The capacitance sensing circuit may include a compensation circuit configured to produce a compensation signal for the conversion circuit based, in part, on at least one of the plurality of mutual capacitances, according to one embodiment.

An embodiment of a method for operating the capacitance sensing circuit described above includes converting a self capacitance of at least one of a plurality of first electrodes to a first digital value, if the first digital value is outside an expected range, coupling a first compensation capacitance to the self capacitance and converting the self capacitance and the first compensation capacitance to a second digital value, if the second digital value is outside the expected range, coupling a second compensation capacitance to the self capacitance and converting the self capacitance and the second compensation capacitance to a third digital value. In one embodiment, if the first or second digital value is within the expected range, processing the first or second digital value to determine if a conductive object is in proximity to at least of the plurality of first electrodes.

An embodiment of a method using mutual capacitances to compensate for panel capacitance in the presence of a conductive liquid on an array of capacitance sensors is described, wherein a first group mutual capacitances is coupled to a first voltage and a second group of mutual capacitances is coupled to a second voltage in a first phase and then a third group mutual capacitances is coupled to the first voltage and a fourth group of mutual capacitances is coupled to the second voltage in a second phase. In one embodiment, the output of the first and second phases may be combined for further processing.

DESCRIPTION OF THE DRAWINGS

FIG. 8A illustrates contact timing diagrams for tap, double-tap, and click-and-drag gestures, according to one embodiment.

FIG. 8B illustrates a plurality of conductive objects moving across a capacitance sensing array to produce a "rotate" gesture, according to one embodiment.

FIG. 8C illustrates a plurality of conductive objects moving across a capacitance sensing array to produce a "pinch" or "zoom-out" gesture, according to one embodiment.

FIG. 8D illustrates a plurality of conductive objects moving across a capacitance sensing array to produce a "grow" or "zoom-in" gesture, according to one embodiment.

FIG. 8E illustrates a plurality of conductive objects moving across a capacitance sensing array to produce a "pan" gesture, according to one embodiment.

FIG. 8F illustrates a conductive object moving across a capacitance sensing array to produce a "next item" or "next page" gesture, according to one embodiment.

FIG. 8G illustrates a conductive object moving across a capacitance sensing array to produce a "scroll" gesture, according to one embodiment.

DETAILED DESCRIPTION

Figure 1A:
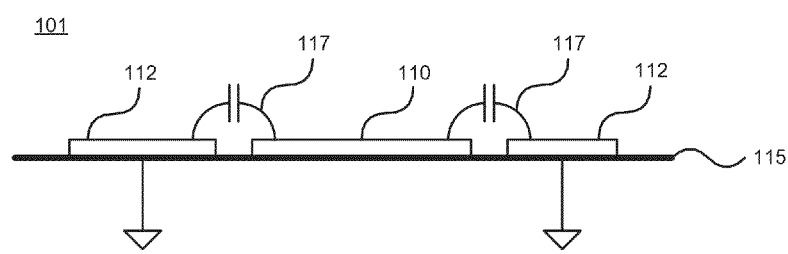
FIG. 1A illustrates a representation of self capacitance, according to one embodiment.

In the following description, for purposes of explanation, numerous specific details are set forth in order to provide a thorough understanding of the embodiments of the present invention discussed herein. It will be evident, however, to one skilled in the art that these and other embodiments may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

For simplicity and clarity of illustration, reference numerals may be repeated among the figures to indicate corresponding or analogous elements. Numerous details are set forth to provide an understanding of the embodiments described herein. The examples may be practiced without these details. In other instances, well-known methods, procedures, and components are not described in detail to avoid obscuring the examples described. The description is not to be considered as limited to the scope of the examples described herein.

Capacitance

A capacitor is formed by two conductive plates that are separated by a space filled with a dielectric material. The capacitance of a capacitor made of two large planes (in farads), C, is given by:

$$C = \varepsilon_r \varepsilon_0 \frac{A}{d}, \quad (1)$$

where A is the area of overlap between the two conductive plates ($m^2$), d is the distance between the two conductive plates (m), $\varepsilon_r$ is the dielectric constant of the material between the two conductive plates, and $\varepsilon_0$ is the electric constant ($\varepsilon_0 \approx 8.854 \times 10^{-12}$ F·$m^{-1}$). In addition, fringe capacitances along the edges of two adjacent conductive plates adds to the total capacitance therebetween.

In one embodiment, the conductive plates may be conventional metal plates (such as copper electrodes). In another embodiment, the conductive plates may be formed from a transparent conductive material (such as indium tin oxide, "ITO"), silver or carbon ink, or metal mesh. In still another embodiment, the conductive plate may be a human finger or palm. Any material that is capable of conducting electricity may serve as a conductive plate of a capacitor.

A capacitor can store a charge transferable to other portions of a circuit. The charge stored by a capacitor (in coulombs), q, is given by:

$$q = CV,\qquad(2)$$

where C is the capacitance of the capacitor given in equation 1 as well as the fringe capacitance and V is the voltage differential between the two conductive plates.

A capacitance may be measured as a self capacitance, the capacitance of a single conductive plate (electrode) to its surroundings which serve as the second conductive plate, or as mutual capacitance, the capacitance between two specific conductive plates. Self and mutual capacitances may be changed by the presence of additional conductive plates, such as a finger, in proximity to the conductive plates under test. For the purposes of this description, conductive plates are referred to as "electrodes" or "sensors." This is not intended to be limiting as circuits may describe the conductive plates of a capacitor in different terms. Additionally, while a finger is a conductive plate for the purposes of creating a capacitor, it may not be referred to as an "electrode" or "sensor." While fingers are used in the following description to be representative of the conductive object that is sensed by the capacitance sensor and measurement circuit, other conductive objects may be used.

Sensor Construction

Figure 7A:
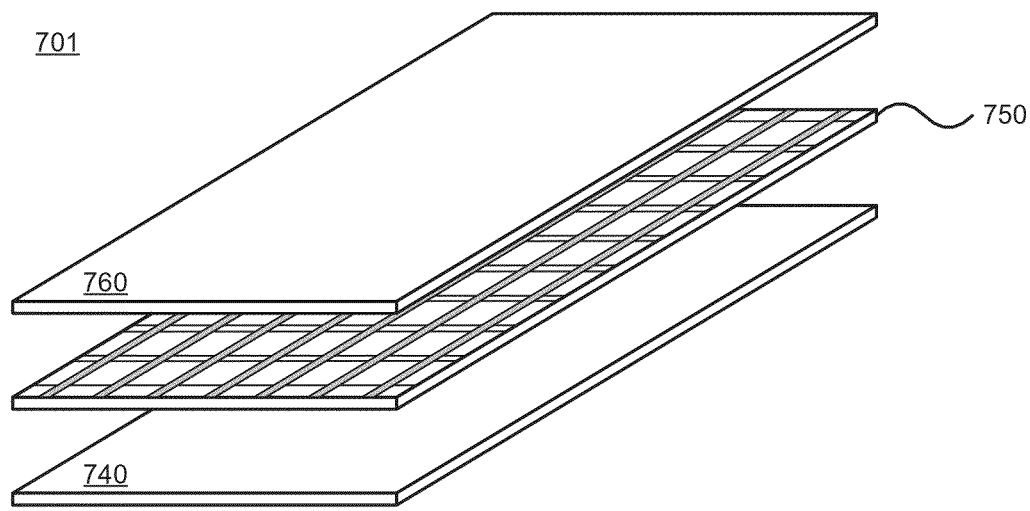
FIG. 7A illustrates a stack-up of a touchscreen, according to one embodiment.
Figure 7B:
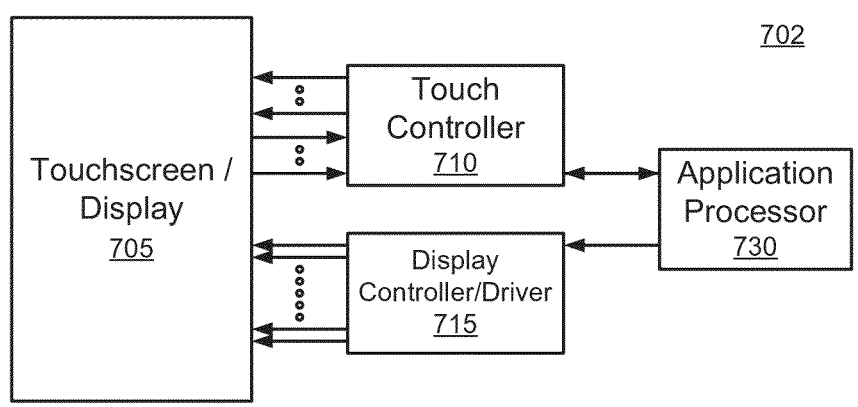
FIG. 7B illustrates a touchscreen system, according to one embodiment.

FIG. 1A illustrates a representation of self capacitance in a system 101 according to one embodiment. An electrode 110 may be disposed on a substrate 115. A capacitance 117 may exist between electrode 110 and at least one other electrode 112 according to Equation (1). In one embodiment, electrodes 110 and 112 may be formed from copper. In another embodiment, electrodes 110 and 112 may be formed from a transparent conductive material such as indium tin oxide (ITO). In still another embodiment, electrodes 110 and 112 may be formed from silver or carbon ink, metal mesh, or another conductive material. Substrate 115 may be glass in one embodiment. In other embodiments, substrate 115 may be a plastic film (such as polyethylene teraphthalate, "PET", or some other polycarbonate), a flexible printed circuit board material, or a rigid printed circuit board material (such as FR4). Substrate 115 may be a separate layer or it may be part of a larger, integrated system as shown in FIGS. 7A and 7B below. While capacitance 117 is shown to be between electrode 110 and electrodes 112, which are coupled to a ground voltage potential, one of ordinary skill in the art would understand that the capacitances between electrodes 110 and 112 may exist at any voltage potential and that a ground connection is not required. Additionally, although only capacitive coupling between electrode 110 and electrode 112 is shown, electrode 110 may have a capacitively couple to circuit elements not shown in FIG. 1A.

Figure 1B:
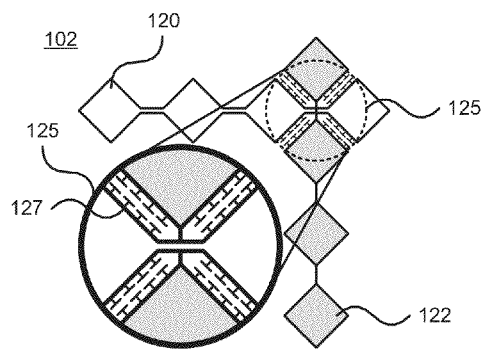
FIG. 1B illustrates a representation of mutual capacitance between a row and a column electrode comprised of diamond-shaped sense elements, according to one embodiment.

FIG. 1B illustrates a representation of mutual capacitance in a system 102 according to one embodiment. A first electrode 120 including multiple diamond-shaped elements may be disposed on a substrate (not shown) along a first axis. A second electrode 122 including multiple diamond-shaped elements may be disposed along a second axis. In one embodiment, there may be a mutual capacitance 127 at the intersection 125 of the electrodes 120 and 122.

In various embodiments, electrodes 120 and 122 may be formed from copper, a transparent conductive material such as indium tin oxide (ITO), silver or carbon ink, metal mesh, or other conductive materials or combinations of conductive materials. The substrate (e.g., see substrate 115 of FIG. 1A), in various embodiments, may be glass, plastic film (such as polyethylene teraphthalate, "PET", or some other polycarbonate), a flexible printed circuit board material, or a rigid printed circuit board material (such as FR4). Additionally, among embodiments, the substrate may be a separate layer or it may be part of a larger, integrated system as shown in FIGS. 7A and 7B below, for example. In one embodiment, electrodes 120 and 122 may be disposed on two different substrates that are adhered together. In other embodiments, electrodes 120 and 122 may be disposed on two sides of the same substrate or may be disposed on the same side of a substrate and the connections for either electrode 120 or electrode 122 formed by a jumper between individual elements of electrodes 120 and 122 and disposed over a dielectric material.

Figure 1C:
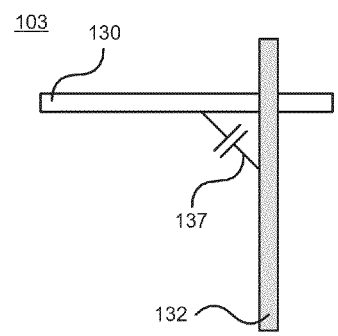
FIG. 1C illustrates a representation of mutual capacitance between a row and a column of bar-shaped electrodes, according to one embodiment.

FIG. 1C illustrates another representation of mutual capacitance in a system 103 according to another embodiment. A first electrode 130 may be disposed on a substrate (e.g., see substrate 115 of FIG. 1A) along a first axis. A second electrode 132 may be disposed along a second axis. Electrodes 130 and 132 may be bar-shaped in one embodiment. In another embodiment, electrodes 130 and 132 may have more complex structures that are based on the bar-shaped theme. At the intersection of electrodes 130 and 132 there may exist a mutual capacitance 137. In one embodiment, electrodes 130 and 132 may be formed from copper. In another embodiment, electrodes 130 and 132 may be formed from a transparent conductive material such as indium tin oxide (ITO). In still another embodiment, electrodes 110 and 112 may be formed from silver or carbon ink, metal mesh, or another conductive material.

Figure 10:
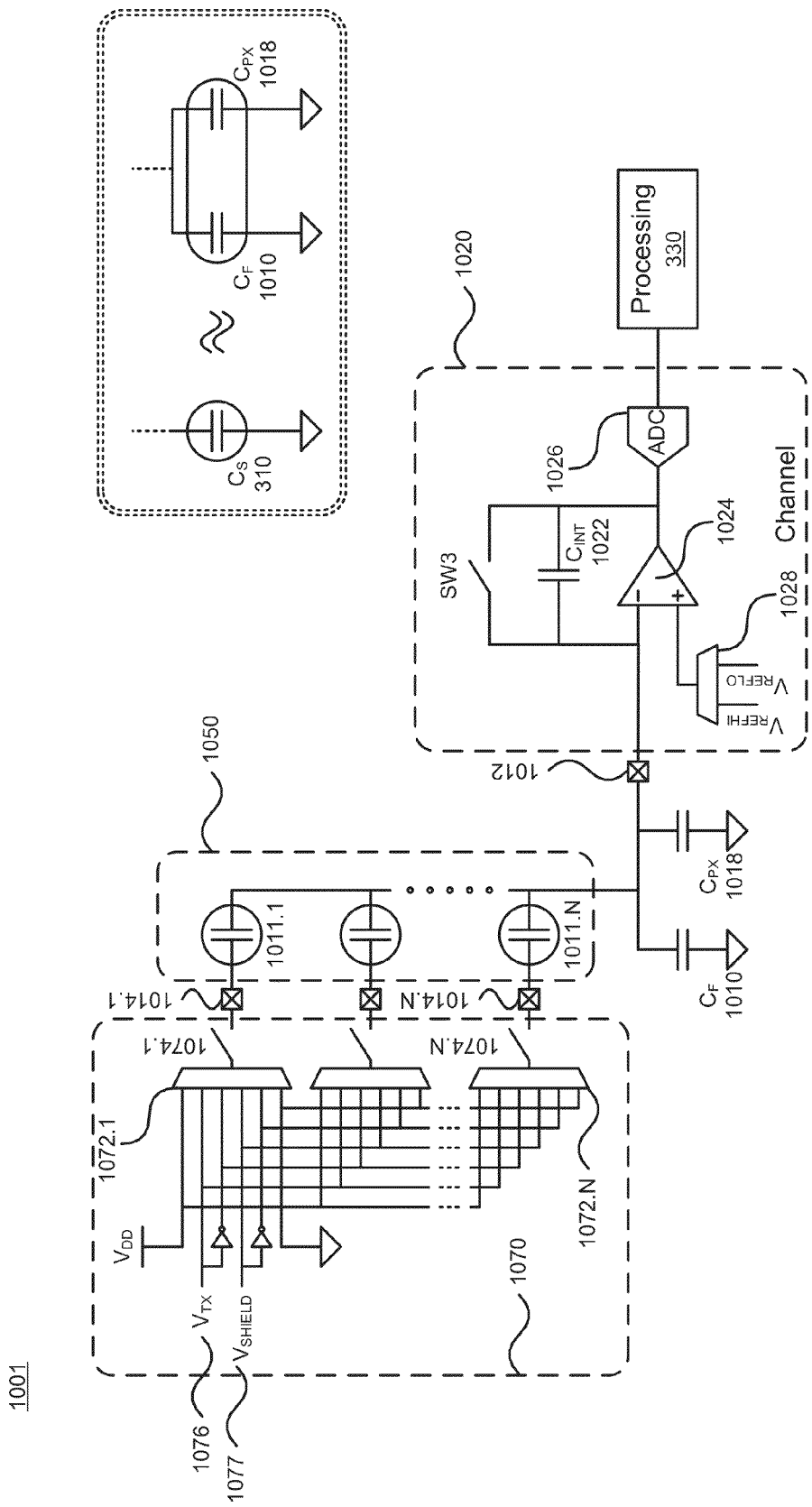
FIG. 10 illustrates a circuit for baseline compensation for self capacitance measurement using the mutual capacitances of the capacitance sensing array with a plurality of drive voltages, according to one embodiment.

Mutual capacitances 127 and 137 may be used to detect the location of one or more conductive objects on or near a surface (e.g. FIGS. 6A through 6E) or they may be used to provide calibration signals or bias currents to a self capacitance measurement circuit (e.g. channel 320 of FIG. 10). An array of mutual capacitances (see description of FIGS. 2A and 2B below) in combination with tuning logic and processing (e.g. tuning 513 and CPU 512 of FIG. 5 below) may be used to provide precise on-panel calibration.

In various embodiments, electrodes 130 and 132 may be formed from copper, a transparent conductive material such as indium tin oxide (ITO), silver or carbon ink, metal mesh, or other conductive materials or combinations of conductive materials. The substrate (e.g., see substrate 115 of FIG. 1A), in various embodiments, may be glass, plastic film (such as polyethylene teraphthalate, "PET", or some other polycarbonate), a flexible printed circuit board material, or a rigid printed circuit board material (such as FR4). Additionally, among embodiments, the substrate may be a separate layer or it may be part of a larger, integrated system as shown in FIGS. 7A and 7B below, for example. In one embodiment, electrodes 130 and 132 may be disposed on two different substrates that are adhered together. In other embodiments, electrodes 130 and 132 may be disposed on two sides of the same substrate or may be disposed on the same side of a substrate and the connections for either electrode 130 or electrode 132 formed by a jumper between individual elements of electrodes 130 and 132 and disposed over a dielectric material.

Figure 2A:
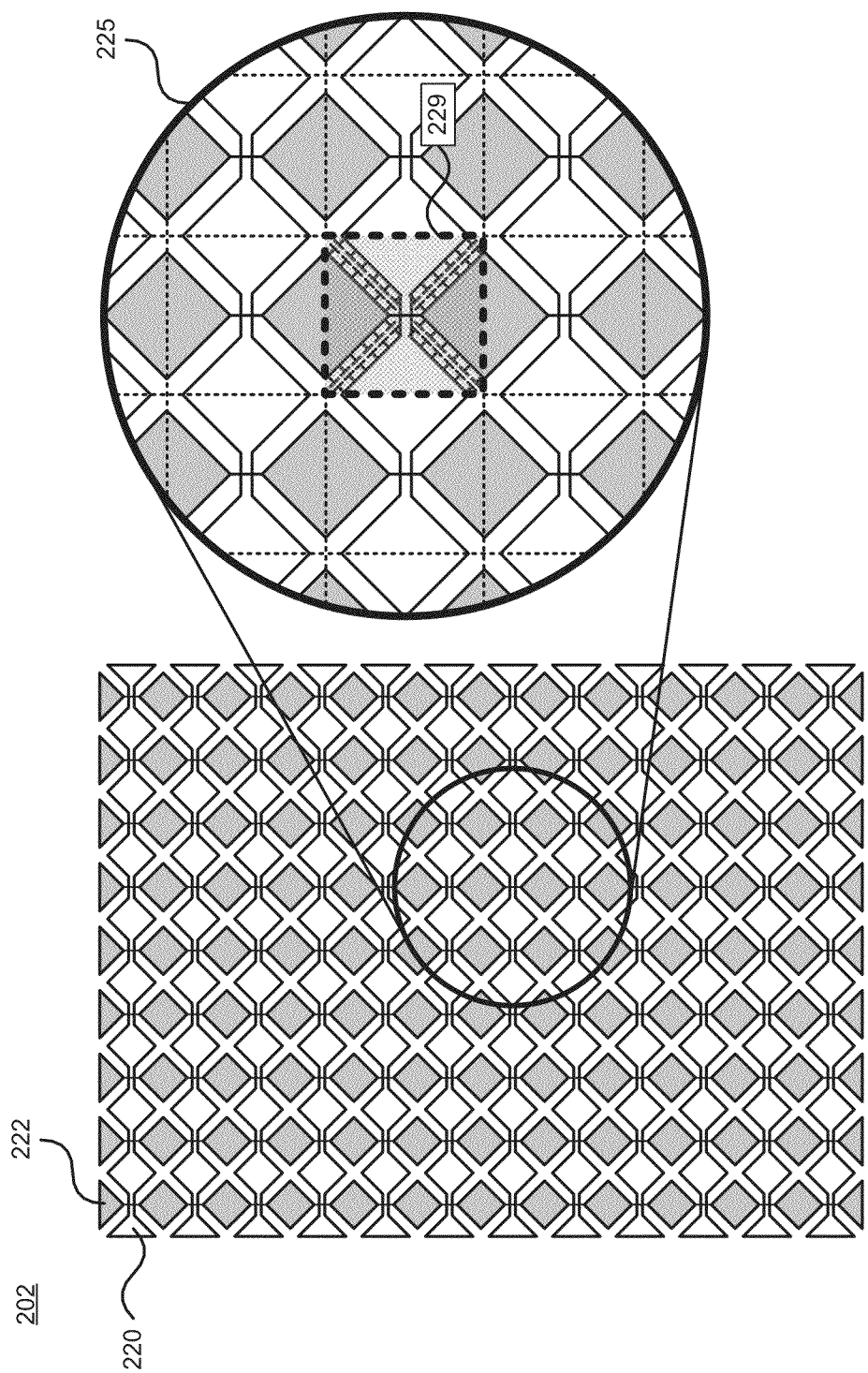
FIG. 2A illustrates an array of diamond-shaped sense elements arranged in a two-dimensional array, according to one embodiment.

FIG. 2A illustrates an array of electrodes 202 similar to those shown in FIG. 1B. A first plurality of electrodes 220 including multiple diamond-shaped elements may disposed on a substrate (not shown) along a first axis. A second plurality of electrodes 222 including multiple diamond-shaped elements may disposed on a substrate along a second axis. Close-up 225 illustrates the intersection between the first plurality of electrodes 220 and the second plurality of electrodes 222. There may be a mutual capacitance at the intersection an electrode from the first plurality of electrodes 220 and an electrode of the second plurality of electrodes 222 (e.g., like mutual capacitance 127 of FIG. 1B). This region of mutual capacitance may be described as a unit cell 229 of the array of electrodes 202.

Figure 2B:
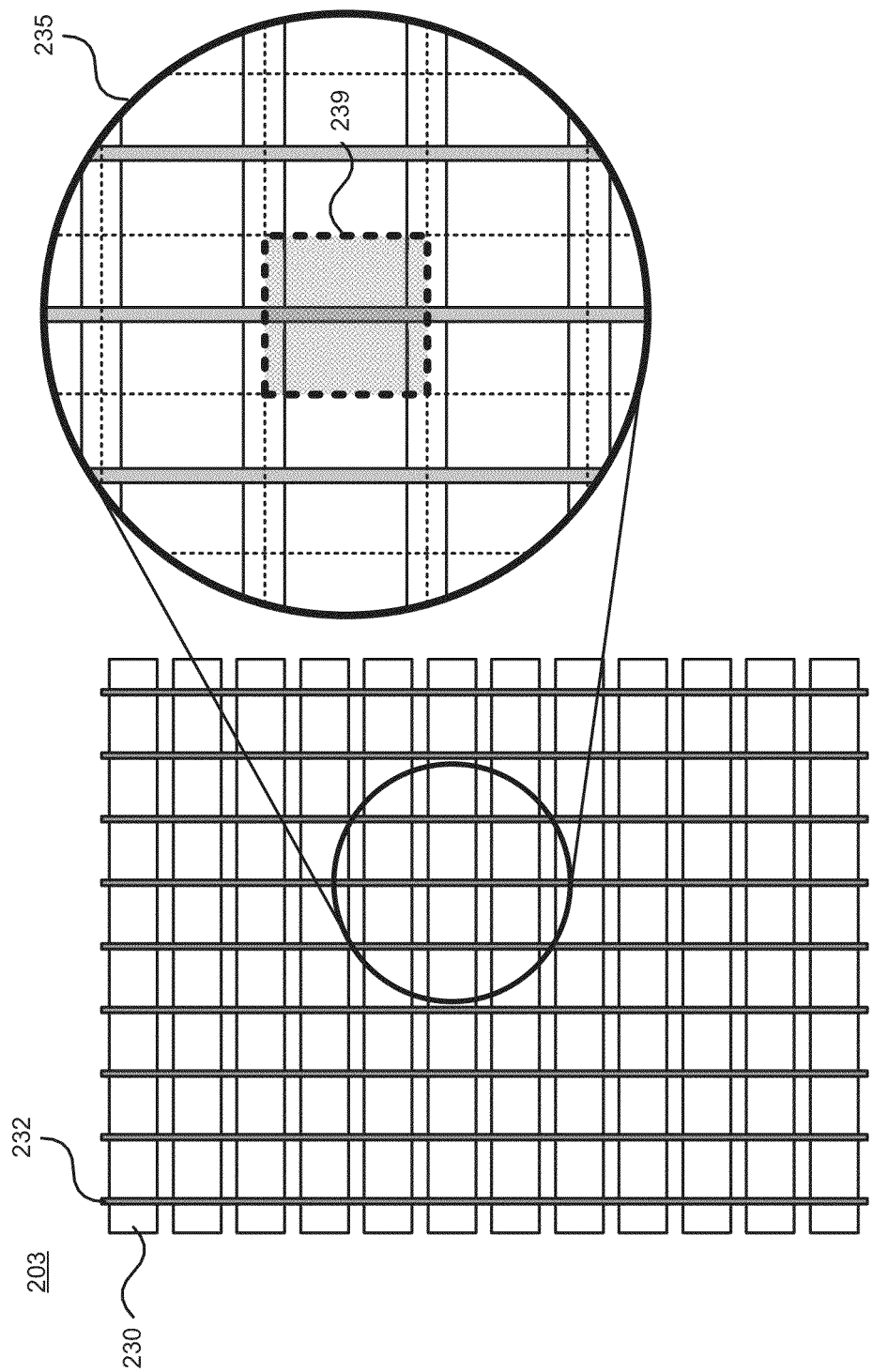
FIG. 2B illustrates an array of bar-shaped electrodes arranged in a two dimensional array, according to one embodiment.

FIG. 2B illustrates an array of electrodes 203 similar to those shown in FIG. 1C. A first plurality of electrodes 230 may be disposed on a substrate (not shown) along a first axis. A second plurality of electrodes 232 may be disposed on a substrate along a second axis. Electrodes 230 and 232 may be bar-shaped in one embodiment. In another embodiment, electrodes 230 and 232 may have more complex structures that are based on the bar-shaped theme. Close-up 235 illustrates the intersection between the first plurality of electrodes 230 and the second plurality of electrodes 232. Similar to FIG. 2A there may be a mutual capacitance at the intersection an electrode from the first plurality of electrodes 230 and an electrode of the second plurality of electrodes 232 and this region of mutual capacitance may be described as a unit cell 239 of the array of electrodes 203.

Unit cells 229 and 239 and their measured capacitance values may be used to detect the location of one or more conductive objects on or near a surface (e.g. FIGS. 6A through 6E) or they may be used to provide calibration signals or bias currents to a self capacitance measurement circuit (e.g. channel 320 of FIG. 10). The array of mutual capacitances of FIGS. 2A and 2B in combination with tuning logic and processing (e.g. tuning 513 and CPU 512 of FIG. 5 below) may be used to provide precise on-panel calibration.

Unit cells 229 and 239 may be conceptualized geometrically as the smallest unit of tessellation. That is, the smallest repeatable unit of measurement on the array. Unit cells 229 and 239 may also be conceptualized by stating that every point within the unit cell is closer to the center of that unit cell (the center of the intersection between the electrodes on different axes) than it is to the center of any other unit cell. Unit cells 229 and 239 may be conceptualized functionally as the native resolution of the arrays 202 and 203. That is, each row and column may be identified and a position defined on each row and column. For a rectangular array with twelve columns and nine rows, there may be 108 discrete locations. Since unit cell 229 exists between the seventh row (from the top) and the sixth column (from the left) and unit cell 239 exists at the intersection between the sixth row and the sixth column, their positions may be given by 6,7 and 6,6, respectively, based on the native resolution of arrays 202 and 203. Unit cells 229 and 239 may be conceptualized as pixels of an array, wherein each pixel may be assigned a location and a measurable value specific to that location. An example of a pixel-based interpretation of unit cells is given in FIGS. 6A and 6B below. Unit cells 229 and 239 may also be referred to as "nodes" wherein each intersection of the row and column electrodes is a node of the array.

Capacitance Sensing

Figure 3A:
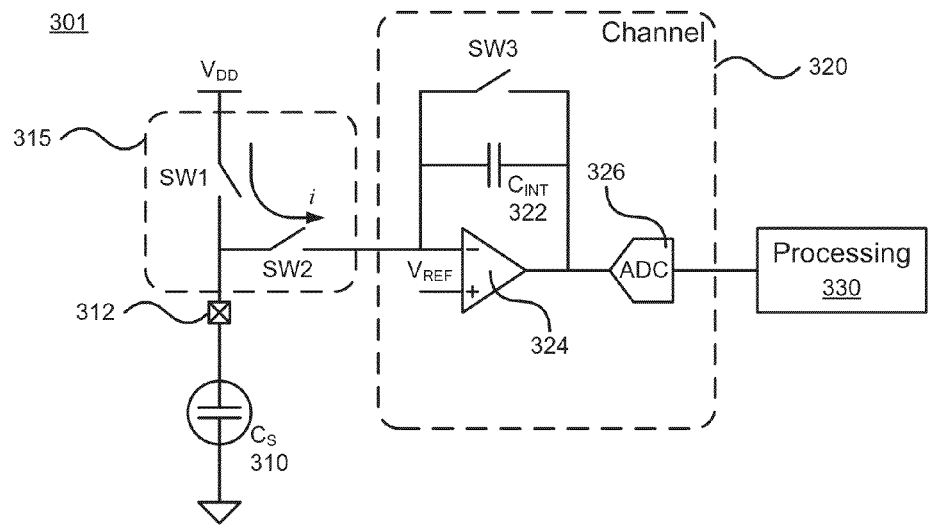
FIG. 3A illustrates as sensing circuit for self capacitance measurement, according to one embodiment.

FIG. 3A illustrates one embodiment of a self capacitance measurement circuit 301. Self capacitance sensor 310 ($C_S$) may be formed between an electrode 110 as shown in FIG. 1A and ground. The non-grounded side of self capacitance sensor 310 may be coupled to a pin 312 of capacitance measurement circuit 301. A switch network 315 may be used to generate a current by alternately charging self capacitance sensor 310 to a voltage ($V_{DD}$) and discharging the accumulated charge onto an integration capacitor 322, which may be part of channel 320. The current from switch network 315 and self capacitance sensor 310 may be given by:

$$I = \frac{V}{R_{eq}}, \tag{3}$$

where the equivalent resistance of the switch network 315 and self capacitance sensor 310 is given by:

$$R_{eq} = \frac{1}{fC_S} \tag{4}$$

where $C_S$ is given by equation (2) and f is the switching frequency of switches SW1 and SW2. Switch network 315 and integration capacitor 322 may be coupled to an input of operational amplifier 324 with a reference voltage ($V_{REF}$) to allow step-wise linear charging of integration capacitor 322. The voltage across integration capacitor 322 may be measured by analog-to-digital converter (ADC) 326, the output of which may be analyzed by processing block 330. After the voltage across integration capacitor 322 by ADC 326, the voltage across integration capacitor 322 may be reset by switch SW3, allowing a new measurement.

Figure 3B:
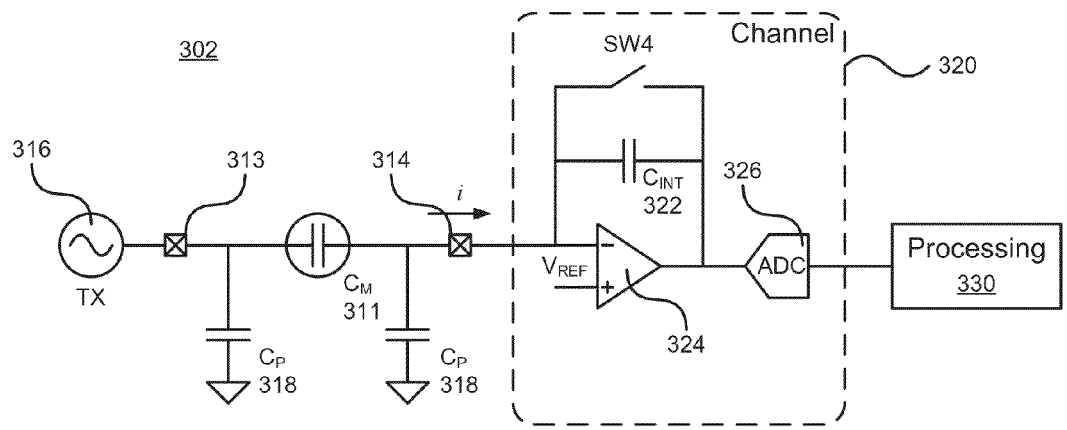
FIG. 3B illustrates as sensing circuit for mutual capacitance measurement, according to one embodiment.

FIG. 3B illustrates one embodiment of a mutual capacitance measurement circuit 302. Mutual capacitance sensor 311 ($C_M$) may be formed at the intersection of two electrodes (120 and 122 of FIG. 1B; 130 and 132 of FIG. 1C), which also have a parasitic capacitance 318 ($C_P$). Each plate of mutual capacitance sensor 311 may be coupled to a pin of mutual capacitance sensing circuit 302. A first pin 313 may be coupled to a signal generator (TX) 316 and a second pin 314 may be coupled to channel 320. The alternating voltage of signal generator 316 may produce a current from mutual capacitance sensor 311 to an integrating capacitor 322 of channel 320. In one embodiment, the voltage across integration capacitor 322 may be measured by ADC 326, the output of which may be analyzed by processing block 330. After the voltage across integration capacitor 322 by ADC 326, the voltage across integration capacitor 322 may be reset by switch SW4, allowing a new measurement. In another embodiment, the current from mutual capacitance sensor 311 may be used to bias an input of a self capacitance measurement circuit 301 similar to that shown in FIG. 3A. The bias provided by the mutual capacitance induced current may provide greater dynamic range of the combination of the integration capacitor 322 and ADC 326.

While channel 320 of FIGS. 3A and 3B are shown to comprise an operational amplifier (324) and an ADC (326), one of ordinary skill in the art would understand that there are many ways to measure a voltage on an integration circuit and that the embodiments of FIGS. 3A and 3B are intended as exemplary and not limiting. For example, ADC 326 may be replaced by a comparator and a counting mechanism gated by the output of the comparator to produce a digital representation of the capacitance on the integrating circuit. In this embodiment, the number of counts from the counting mechanism may represent the time required to charge the integrating circuit to a reference voltage of the comparator. Larger charging currents may produce faster charging of the integrating circuit and lower count values.

Capacitance measurement circuits such as those in shown in FIGS. 3A and 3B may implemented on an integrated circuit (IC) alone or with several instances of each to measure the capacitances of a plurality of inputs.

Figure 4A:
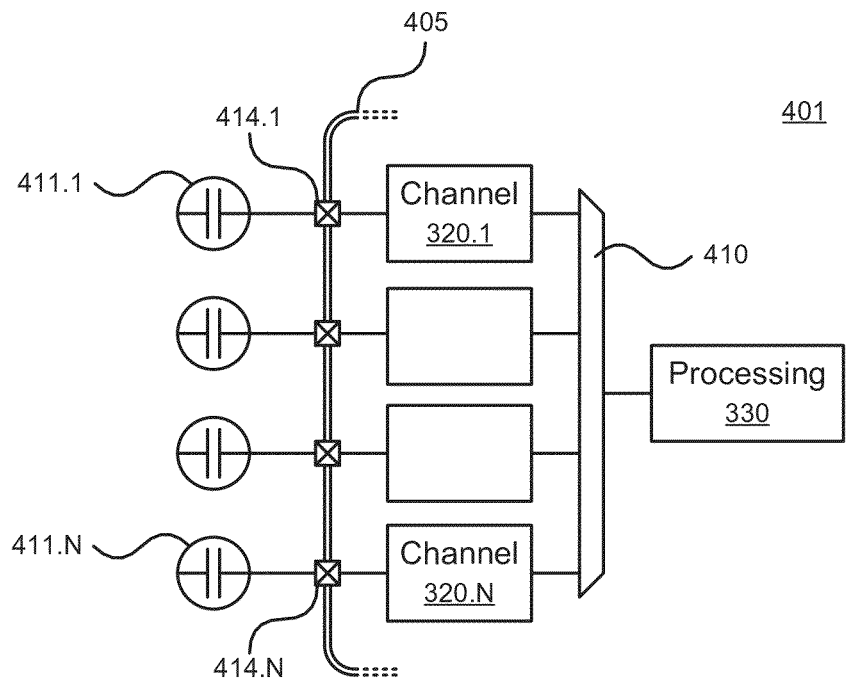
FIG. 4A illustrates connections between a plurality of sensing channels and a plurality of measurable capacitances, according to one embodiment.

FIG. 4A illustrates a circuit 401 for measuring multiple capacitances 411.1 through 411.N according to one embodiment. In circuit 401, four capacitances 411.1 through 411.N may be coupled to pins 414.1 through 414.N of sensing IC 405. Each mutual capacitance 411.1 through 411.N may be coupled to channels 320.1 through 320.N and the outputs of each of channels 320.1 through 320.N coupled to a processing block 330 through multiplexor 410.

Figure 4B:
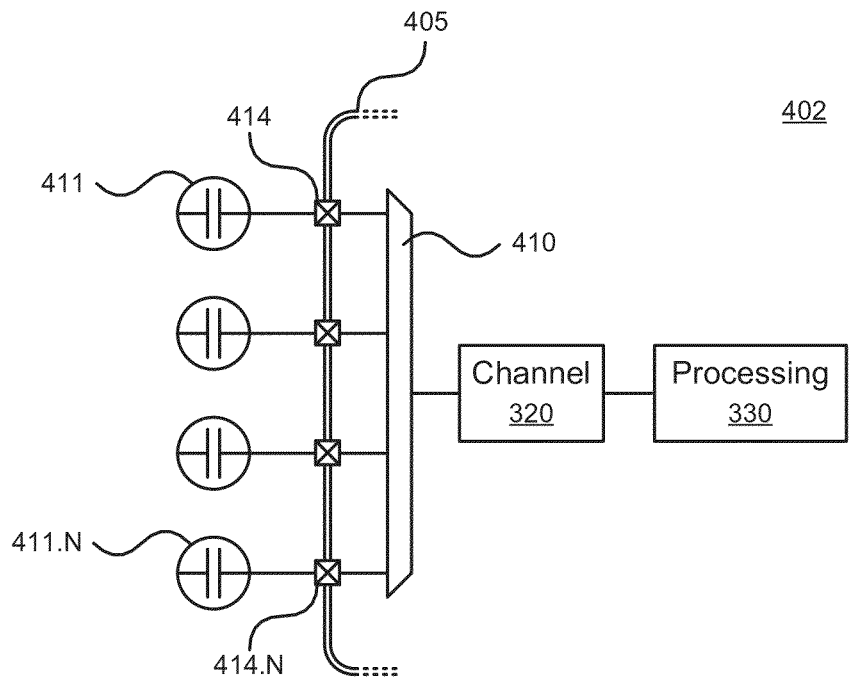
FIG. 4B illustrates connections between a single sensing channel and a plurality of measurable capacitances, according to one embodiment.

FIG. 4B illustrates a circuit 402 for measuring multiple capacitances 411.1 through 411.N according to another embodiment. In circuit 402, four capacitances 411.1 through 411.N may be coupled to pins 414.1 through 414.N of sensing IC 405. Each capacitance 411.1 through 411.N may be coupled to an input of multiplexor 410, the output of which may be coupled to channel 320. The output of channel 320 may be coupled to processing block 330.

FIGS. 4A and 4B illustrate the logical extremes of individual channels for each capacitance or a single channel for all capacitances. However, in another embodiment, different combinations of the circuits of FIGS. 4A and 4B may be implemented. For example, multiple channels 320 may be coupled to multiple capacitances 411. In one embodiment, the capacitances may be distributed evenly across all the available channels. In another embodiment, the capacitances may be distributed unevenly, with certain channels configured to measure capacitance on more pins than other channels. Additionally, while FIGS. 4A and 4B illustrate four capacitances, pins, or channels, one of ordinary skill in the art would understand that more or less than four of each may be used. Additionally, the number of capacitances, pins, and channels may be the same or they may be different, depending on the design requirements.

Capacitances 411.1 through 411.N may be coupled to signals opposite to pins 414.1 through 414.N to produce a current input to channel 320 representative of a measured capacitance as described in FIG. 3. In another embodiment, capacitances 411.1 through 411.N may be coupled to signals to produce a current used for calibration of circuits 401 and 402. Calibration may be controlled by a processing device (e.g. tuning block 513 and CPU 512 of FIG. 5) and implemented as shown in FIG. 10, below.

While FIGS. 4A and 4B illustrate a multiplexor, one of ordinary skill in the art would recognize that a plurality of switches may be configured to perform similar functionality as a multiplexor. The representation of the mechanism by which capacitances 411.1 through 411.N are coupled to channel 320 or how channels 320.1 through 320.N are coupled to processing block 330 by a multiplexor is merely exemplary and not intended to limit the description to a specific circuit element.

Processing

Figure 5:
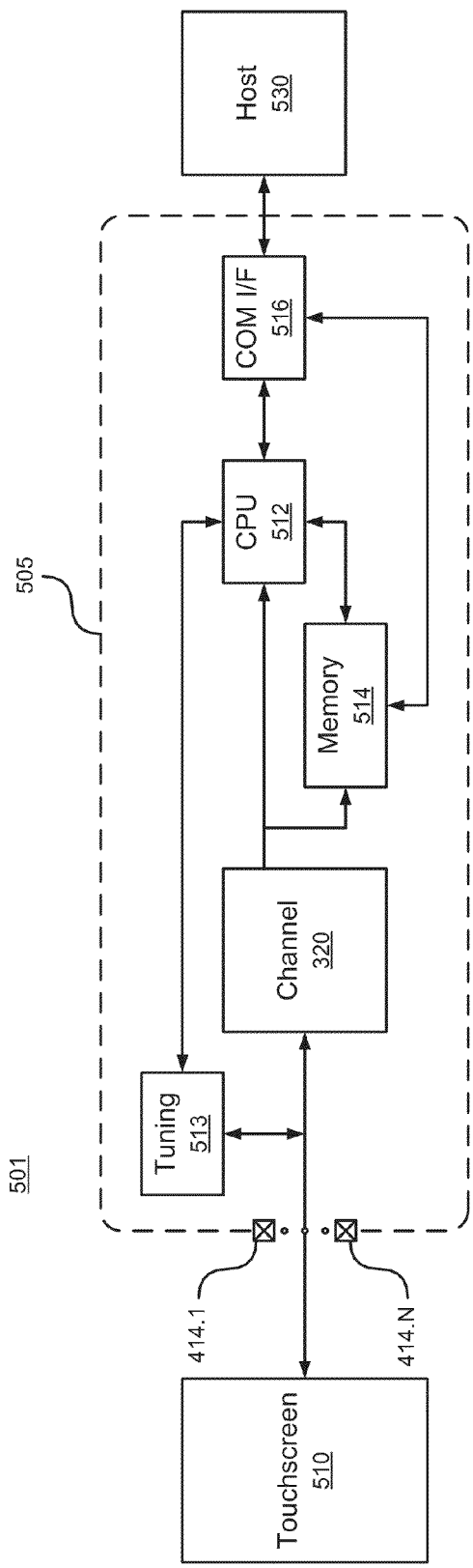
FIG. 5 illustrates a flow of information and control signals in a capacitance sensing system, according to one embodiment.

FIG. 5 illustrates one embodiment of a touchscreen system 501. A touchscreen 510 may be coupled to a sensing IC 505 though pins 414 (e.g., 312 in FIG. 3A, 313 and 314 in FIG. 3B, and 414 in FIGS. 4A and 4B). Sensing IC 505 may comprise a channel 320 coupled to the touchscreen electrodes of touchscreen 510 (illustrated in FIGS. 2A and 2B). In one embodiment, the output of channel 320 may be sent to CPU 512 for processing (as shown in FIGS. 3A and 3B) and then either communicated to a host 530 through communication interface 516 or stored in a memory 514 and communicated to host 530 through communication interface 516 from memory 514. In another embodiment, the output of channel 320 may be stored in memory 514 directly (before processing by CPU 512) and either processed by CPU 512 from memory 514 and then communicated to host 530 through communication interface 516 or communicated to host 530 from memory 514 through communication interface 516 without CPU intervention. Tuning and calibration routines may be stored in memory 514 and implemented by CPU 512 through Tuning block 513. Calibration of signals from touchscreen 510 through and by channel 320 may provide capacitance measurement data with greater signal-to-noise ratios and fidelity to user interactions. One embodiment of calibration may be found in FIG. 10 below.

Capacitance measurement data from channel 320 may be representative of the total capacitance measured by channel 320. That is, the capacitance of self or mutual capacitances of FIGS. 1A through 1C may be converted to a digital value. The digital value may include the parasitic capacitance (318 of FIGS. 3A and 3B) as well as the native mutual capacitance with no figure present (311 of FIG. 3B) and the capacitance of the conductive object or finger. The parasitic capacitance and native mutual capacitance may be subtracted from the measured value as a baseline to yield difference values that are representative of the capacitance from the conductive object or finger. Difference values may be analyzed by processing block 330 to determine if a conductive object is proximate to the array as well as higher-level user interactions.

Figure 6A:
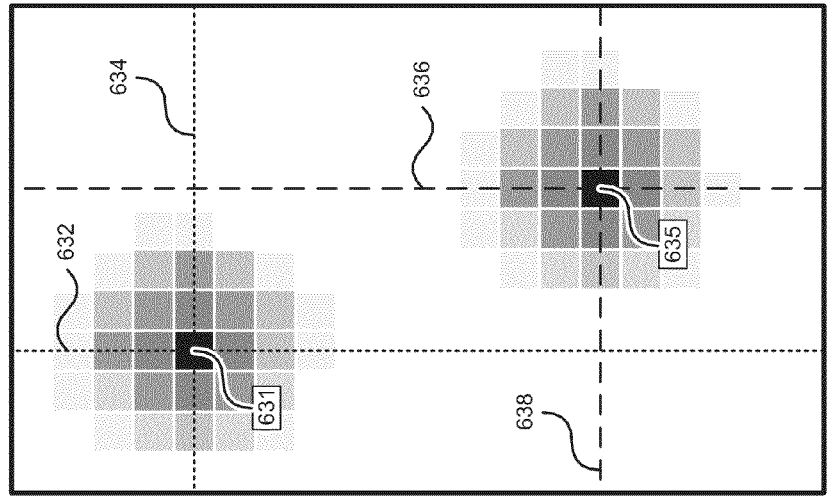
FIG. 6A illustrates measured changes in capacitance numerically on an capacitance sensing array, according to one embodiment.

FIG. 6A illustrates numerical difference values 601 for a plurality of intersections 611 of a mutual capacitance sensing array. Numerical difference values 601 may be derived from the raw values of, for example, channel 320 (FIG. 3B) for every unit cell (229 of FIG. 2A and 239 of FIG. 2B) or mutual capacitance, $C_M$, 311 (FIG. 3B). In one embodiment, numerical difference values may be the difference between the raw count values output from channel 320 and a baseline value. In one embodiment, the baseline value may be stored globally for the entire array. In another embodiment, the baseline value may be stored for each intersection individually. In another embodiment, the baseline value may be stored for multiple groups of sensors depending on each sensor's position on the touchscreen, noise performance of individual sensors, other design restraints. Baseline values may be determined during development in one embodiment. In another embodiment, baseline values may be calculated at start-up or may be updated during operation of the touchscreen to account for variations in noise experienced by the touchscreen electrodes, physical changes on the touchscreen (heat, humidity, etc.), or other sources of drift in the output channel (e.g., channel 320).

Figure 6B:
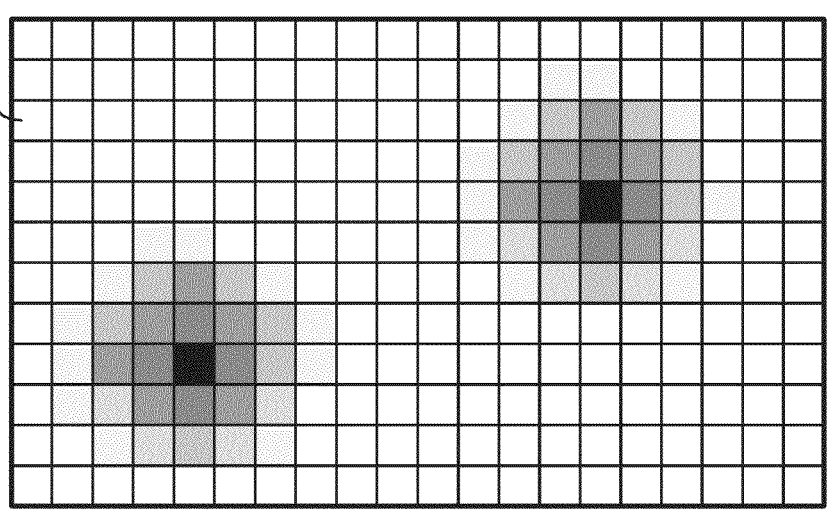
FIG. 6B illustrates measured changes in capacitance graphically on an capacitance sensing array, according to one embodiment.

The numerical difference values 601 of FIG. 6A may be illustrated graphically as heat map 602 in FIG. 6B. The shade of each cell or mutual capacitance 601 of heat map 602 may indicate of the numerical difference values 601 of FIG. 6A. Darker cells may indicate of greater capacitive coupling of a mutual capacitance electrode with a conductive object and less capacitive coupling between the mutual capacitance electrodes themselves. For clarity of description, the representation illustrated in FIG. 6B is used for subsequent figures.

Figure 6C:
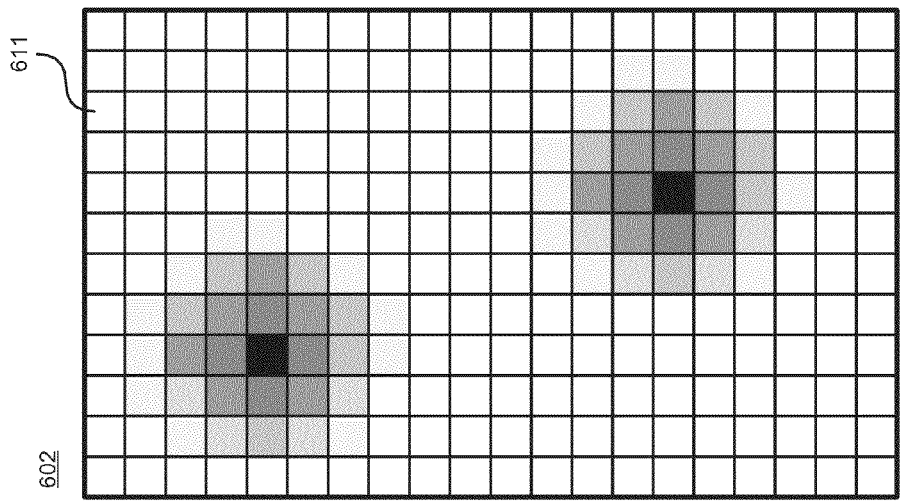
FIG. 6C illustrates a plurality of detected peaks on a capacitance sensing array, according to one embodiment.

FIG. 6C illustrates an example of peak detection scheme 603 based on the data from FIGS. 6A and 6B. The peak detection scheme 603 may compare each unit cell (229 of FIG. 2A and 239 of FIG. 2B) or mutual capacitance 611 (FIGS. 6A and 6B) to those around it. Unit cells or mutual capacitances with the highest different value may be identified as peaks and given an identifier and position. A first peak 631 may be given a first position (X-axis 632 and Y-axis 634). A second peak 635 may be given a second position (X-axis 636 and Y-axis 638).

Figure 6F:
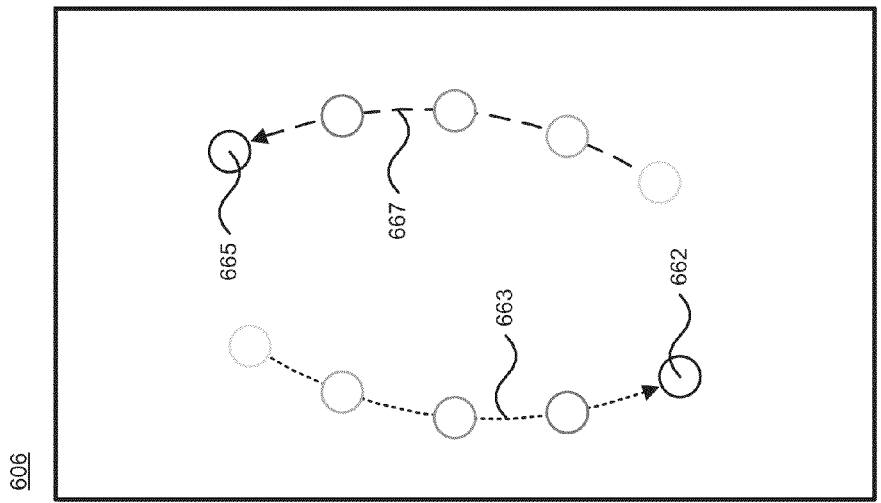
FIG. 6F illustrates a representation of tracking a plurality of conductive objects moving across a capacitance sensing array.
Figure 6E:
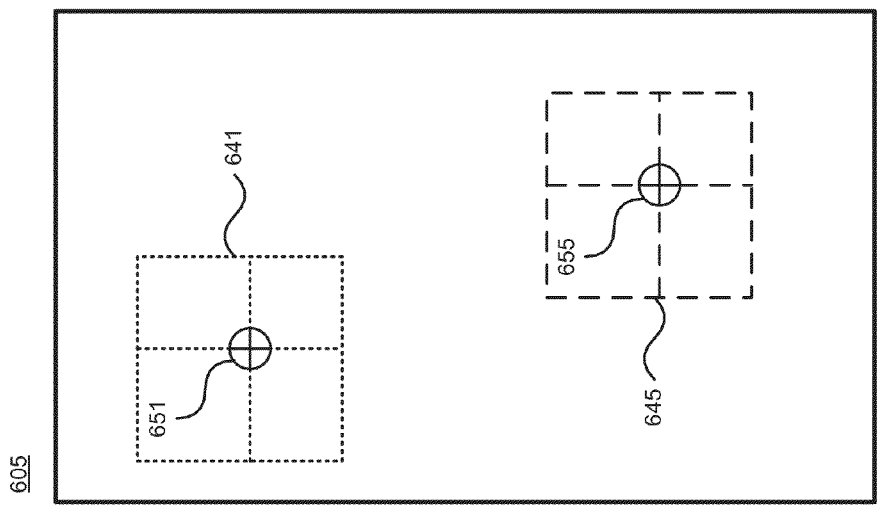
FIG. 6E illustrates the result of a centroid calculation with a 5×5 window of sensors for two conductive objects, according to one embodiment.
Figure 6D:
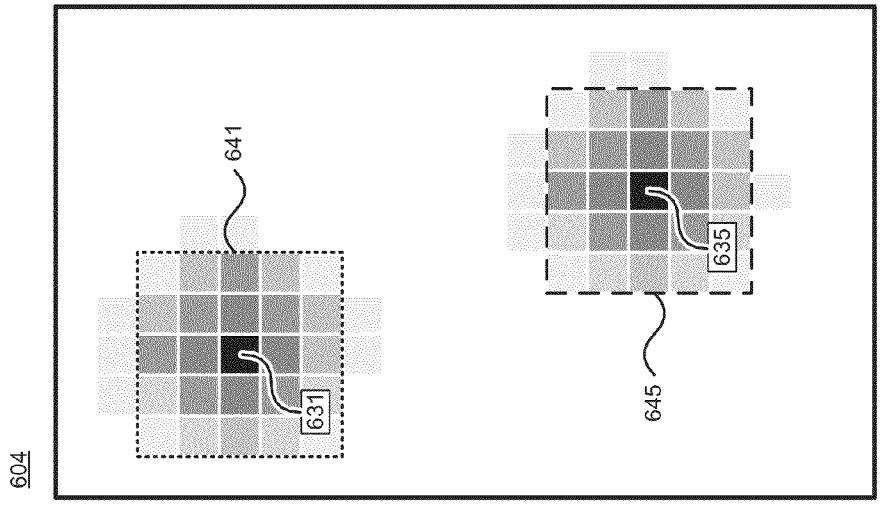
FIG. 6D illustrates a centroid calculation with a 5×5 window of sensors, according to one embodiment.

FIG. 6D illustrates an example of centroid calculation 604 wherein an array of sensors surrounding each peak is defined and processed. First peak 631 may be used to define a first array 641 including the 25 unit cells around and including the unit cell at first peak 631. Second peak 635 may be used to define a second array 645 including the 25 unit cells around and including peak 631. The values of first array 641 and second array 645 may be processed to find the centroid or center of mass of the conductive object based on the values contained within each array (641 and 645). While symmetrical 5×5 arrays are illustrated in and describe with regard to FIG. 6D, in various embodiments, the arrays may have different dimensions and consequently different numbers of unit cells. Such various embodiments may include 3×3, 4×4, or larger arrays. The arrays may position peaks in the center or the peaks may be offset. Additionally, the arrays may be asymmetrical, with a greater number of rows or columns, or irregular, where each row or column may have a different number of unit cells.

FIG. 6E illustrates an example of the first and second centroids 651 and 655 calculated from first and second arrays 641 and 645 of FIG. 6D.

FIG. 6F illustrates an example of two conductive objects 661 and 665 moving across a touchscreen and their positions along tracks 663 and 667, respectively.

FIG. 7A illustrates one embodiment of a touchscreen stackup of touchscreen system 501 (from FIG. 5). Touchscreen stackup 701 may include a display 740. Above display 740 may be disposed a sensor layer 750. Between sensor layer 750 and a conductive object, such as a finger, may be disposed a cover layer 760.

While sensor layer 750 is shown to be on the same layer of a substrate, this is merely exemplary. In one embodiment, sensor layer 750 may be disposed on the bottom of cover layer 760, reducing the number of layers from three to two in touchscreen stackup 701. In another embodiment, sensor layer 750 may be disposed on the top of display 740, also removing a layer from touchscreen stackup 701. In another embodiment one or both axes of the electrodes shown on sensor layer 750 may be disposed at various depths within the display. For example, sensor layer 750 may implemented as in-cell, on-cell, or a hybrid of in-cell and on-cell. Additionally, sensor layer 750 may share certain electrodes with display 740.

Touchscreen stackup 701 is illustrated in a touchscreen system 702 in FIG. 7B, according to one embodiment. Touchscreen/display 705 (analogous to touchscreen stackup 701 of FIG. 7A) may be coupled to touch controller 710 and display controller/driver 715. Touch controller 710 may be configured to sense either self capacitance (FIG. 3A) or mutual capacitance (FIG. 3B) or both. The output of the touch controller 710 may be communicated to an application processor 730. Touch controller 710 may also be configured to receive commands and data from application processor 730. Information that may be communicated to application processor 730 by touch controller 710 may include the following data for each identified conductive object on the array:

Age of Detection—How long (in number of scans) a touch has been present on the touchscreen;

X-Axis Position—The position along the horizontal axis of the conductive object on the array;

Y-Axis Position—The position along the vertical axis of the conductive object on the array;

Z-Axis Intensity—The strength of the touch which may be indicative of the size of the conductive object or the pressure with which the conductive object presses against the touch surface;

Contact Area Major Axis Length—The long axis of an ellipse centered on the location of the conductive object on the array;

Contact Area Minor Axis Length—The short axis of an ellipse centered on the location of the conductive object on the array;

Contact Area Major Axis Angle—The angle (from vertical) of the long axis of an ellipse centered on the location of the conductive object on the array;

Touchdown/Liftoff Debounce—Whether there is debounce (or hysteresis) for the detection of the conductive object on the array and whether/where the detection is within the debounce;

Conductive Object Identification—The type of touch (bare finger, gloved finger, stylus, hover, proximity, etc.);

Conductive Object Size—Large conductive object or a regular-sized conductive object; and Gestures (discussed in more detail with regard to FIGS. 8A through 8G).

Application processor 730 may also be coupled to display controller/driver 715 to control what is shown on touchscreen/display 705.

Touch controller 710 may also be configured to use the mutual capacitances (e.g. 127 and 137 of FIGS. 1B and 1C, respectively) with drive voltages and signals to bias the input of channel 320 (FIG. 3) and provide calibrated inputs to the digital conversion of capacitance (see ADC 1026 of FIG. 10, below). In one embodiment, the touch controller 710 may be configured to perform the calibration steps autonomously, either periodically, at power on, or when certain criteria are met. In another embodiment, the touch controller 710 may receive a command from application processor 730 to perform the calibration based on the information reported to application processor 730.

FIG. 8A illustrates examples of capacitance measurement data for a single conductive object as might be interpreted to be single-touch gestures. A detection of a conductive object in FIG. 8A is illustrated as a digital ON/OFF or HIGH/LOW of the conductive object on the capacitance sensor. A single-tap gesture 810 may be detected as a presence of a conductive object detected and then the absence of a conductive object detected to define first touch 811. A double-tap gesture 812 may be detected as a presence of a conductive object detected and then the absence of a conductive object detected to define a first touch 811, then within a specified time a second touch 813 detected. A click-and-drag gesture 814 may be detected as a presence of a conductive object detected and then the absence of a conductive object detected to define a first touch 811, then within a specific time a second touch 815 detected. A click-and-drag gesture may also move a cursor on a display as the second touch remains on the touch surface and moves across the surface.

FIGS. 8B through 8E illustrate examples of gestures based on detection of two conductive objects. In one embodiment, conductive objects 821 and 823 may move in a circular motion about some center point, either clockwise or counterclockwise to produce a rotate gesture 802. In another embodiment, conductive objects 821 and 823 may move closer together along a substantially linear path to produce a "pinch" or "zoom out" gesture 803. In another embodiment, conductive objects 821 and 823 may move farther apart along a substantially linear path to produce a "grow" or "zoom in" gesture 804. In another embodiment, conductive objects 821 and 823 may move along substantially parallel paths to produce a "pan" gesture 805.

FIGS. 8F and 8G illustrate gestures based on detection of a single contact moving across a capacitance sensing array. In one embodiment, conductive object 821 may move in a substantially straight line to produce a "next item" gesture 806. In another embodiment, conductive object 821 may move in a circular motion about some center point, either clockwise or counter-clockwise to produce a scroll gesture 807.

Figure 9:
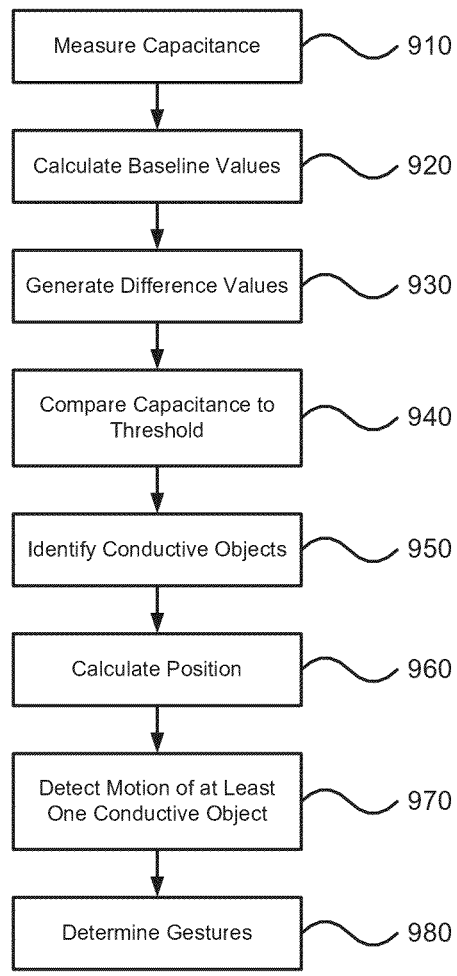
FIG. 9 illustrates a method for measuring capacitance on a touchscreen and outputting a result, according to one embodiment.

FIG. 9 illustrates one embodiment of a method 901 of sensing a touchscreen array and determining the appropriate display. Capacitance is first measured in step 910. Step 910 may correspond to self capacitance measurement or mutual capacitance measurement and may use sensing circuits similar to those described in FIG. 3A or 3B. In other embodiments, other self or mutual capacitance sensing methods may be used. Raw capacitance values may be used to create a baseline in step 920. Baseline values may then be subtracted from the raw capacitance values in step 930 to generate difference values (as shown in FIG. 6A). In one embodiment, difference values may be used to determine calibration parameters for hardware configuration. Calibration parameters may include coupling various unit cells (e.g. 229 and 239 of FIGS. 2A and 2B, respectively) to drive signals such that bias currents are provided to the digital conversion of a measurable capacitance (e.g. FIG. 10, below). Difference values from step 930 may compared to threshold values in step 940 to determine if a conductive object is present on the array sufficient enough to process. If the difference values are above the threshold values, conductive objects are detected in step 950. In one embodiment, the detection of conductive objects may be by identifying peaks as illustrated in FIG. 6C. The position of each conductive object on the array may be calculated in step 960 from the capacitance values. In one embodiment, position may be calculated as described with regard to FIGS. 6D and 6E. The position of each conductive object on the array may be tracked over time to detect motion (or lack thereof) of each conductive object in step 970, as illustrated in FIG. 6F. Finally, the presence, absence, and position of each conductive object may be monitored and used to detect gestures in block 980 as illustrated in FIGS. 8A through 8G.

In one embodiment, the entire method 901 of FIG. 9 may be completed by touch controller 710 of FIG. 7. In another embodiment, various steps of method 901 may be completed by an external processor such as application processor 730 of FIG. 7. In this embodiment, data may be communicated to and from touch controller 710 through communication interface 516 of FIG. 5. Information communicated to the host may be stored in a memory (such as memory 514) or communicated through a processing unit (such as CPU 512). In another embodiment, additional processing steps may be completed by touch controller 710 or application processor 730 and the results of those steps used in performing the steps of method 901 illustrated in FIG. 9.

Hardware Baselining

FIG. 10 illustrates an embodiment of a hardware baseline circuit 1001 according to one embodiment of the present invention. Hardware baseline circuit 1001 may be used to compensate for panel capacitance ($C_{PX}$) 1018 when operating in self capacitance sensing mode. Sensor capacitance $C_S$ (310 of FIG. 3A) may be comprised of panel capacitance 1018 as well as the capacitance from a conductive object $C_F$ 1010 (such as a finger or stylus) 1010, referred to here as "finger capacitance." While the present application refers to the capacitance from a conductive object as "finger capacitance," this capacitance may be from conductive objects other than fingers, such as styli, a face, or the palm of a hand. Panel capacitance 1018 may be many orders of magnitude larger than finger capacitance 1010, such that the range of the capacitance sensing circuit may be saturated by panel capacitance 1018, making finger capacitance 1010 difficult to distinguish. The self capacitance measurement of circuit 1001 may be similar to that described with regard to self capacitance measurement circuit 301 of FIG. 3A. In hardware baseline circuit 1001, the panel capacitance 1018 and finger capacitance 1010 may be coupled to channel 1020 through pin 1012. Panel capacitance 1018 and finger capacitance 1010 may then charge integration capacitor 1022, the voltage across which is converted to a digital value by ADC 1026. The digital output of ADC 1026 may then be analyzed by processing block 330. Operational amplifier (opamp) 1024 may generate a linear charge ramp for integration capacitor 1022 similar to that of opamp 324 of FIG. 3A. Opamp 1024 may have two input voltages, $V_{REFHI}$ and $V_{REFLO}$, controllable by multiplexor 1028. This scheme may provide a square wave input to opamp 1024. However, in another embodiment, a square wave signal generator not derived from a multiplexor with two voltage inputs may be used. After the voltage across integration capacitor 1022 is measured by ADC 1026, it may be reset by switch SW3. To reduce the impact of the panel capacitance on the output of channel 1020, the mutual capacitances 1011.1 through 1011.N (collectively baseline capacitance 1050) that exist on the capacitance sensing array (e.g., see arrays 202 and 203 of FIGS. 2A and 2b, respectively at the intersections of electrodes (e.g., see mutual capacitances 127 and 137 between electrodes 120 and 122 of FIG. 1B and electrodes 130 and 132 of FIG. 1C, respectively) may be coupled to channel 1020 through pin 1012. Mutual capacitances 1011.1 through 1011.N may be coupled to various voltages individually or in combination to create compensation charges at one plate such that they effectively cancel out the charge provided to integration capacitor 1022 by panel capacitance 1018. The other plate of mutual capacitances 1011.1 through 1011.N may be coupled to pins 1014.1 through 1014.N. Mutual capacitances 1011.1 through 1011.N may provide charge to the channel as shown in FIG. 3B. Compensation charge supplied to the channel may be given by:

$$Q_{compensation} = \Sigma_{n=1}^{N}(\text{Amplitude}(n) \cdot V_{driver}) \cdot C_{m(n)}, \quad (5)$$

where $C_{m(n)}$ is the number of mutual capacitance 1011.1 through 1011.N used, Amplitude$_{(n)}$ is an applied scalar to those capacitances, and $V_{driver}$ is the value of the drive voltage on the input of multiplexors 1072.1 through 1072.N corresponding to each of the mutual capacitances 1011.1 through 1011.N.

The voltages to which mutual capacitances 1011.1 through 1011.N are coupled may be set by drive circuit 1070 and controlled by multiplexors 1072.1 through 1072.N and switches 1074.1 through 1074.N. First, the specific mutual capacitance may be coupled to the input of channel 1020 by closing the appropriate switch 1074.1 through 1074.N. The current that is input to channel 1020 may then determined by the mutual capacitance and the drive voltage. In one embodiment, there may be two predetermined drive voltages, $V_{TX}$ 1076 and $V_{SHIELD}$ 1077, and their respective compliments as well as ground and $V_{DD}$. Each of these voltages may be coupled to specific mutual capacitances 1011.1 through 1011.N such that the current on the input of channel 1020 from panel capacitance 1018 is offset. This may increase the range of measurable finger capacitances on integration capacitor 1022 by reducing the impact of the panel capacitance on the digital conversion. In another embodiment, the reference voltage of opamp 1024 may be reduced of the voltage range between $V_{REFHI}$ and $V_{REFLO}$ reduced. Additionally, while FIG. 10 shows switches at the inputs of the multiplexors, one of ordinary skill in the art would understand that the inputs of multiplexors may have unconnected inputs, rather than explicit switches to achieve the same control.

Figure 11:
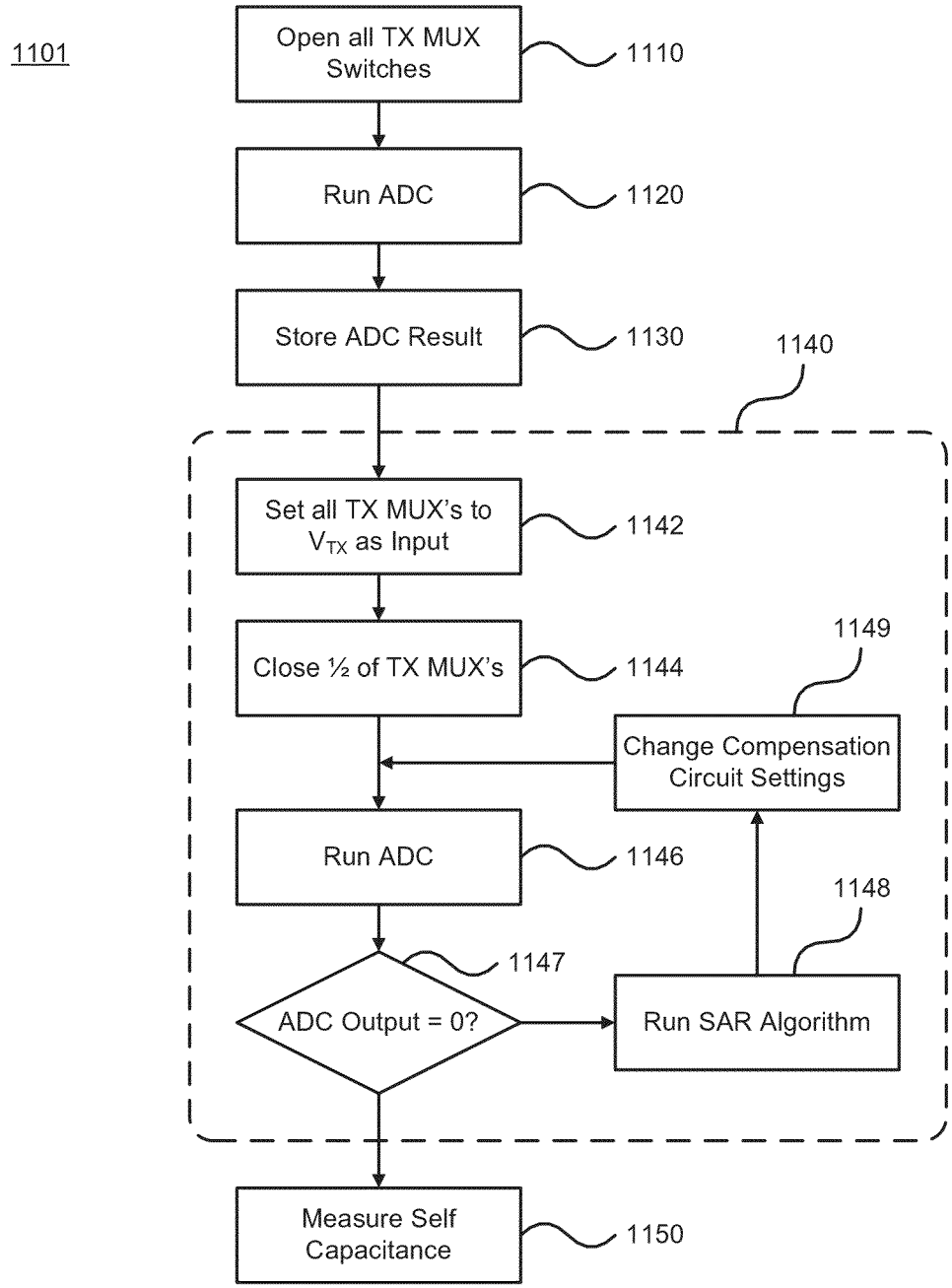
FIG. 11 illustrates a method for baseline compensation for self capacitance measurement using the mutual capacitances of the capacitance sensing array, according to one embodiment.

FIG. 11 illustrates a method 1101 of operation for hardware baseline circuit 1001 of FIG. 10, according to one embodiment. In step 1110, all TX multiplexor switches (1074.1 through 1074.N) are opened, leaving the mutual capacitances 1011.1 through 1011.N floating. ADC 1026 is then run in step 1120 to generate an uncompensated value for the sensor capacitance ($C_S$ from FIG. 3A, $C_F$ and $C_{PX}$ from FIG. 10). The uncompensated value is stored to a memory (such as memory 514 of FIG. 5) in step 1130. The hardware compensation scheme may then be performed in step 1140. First, all of the TX multiplexors (1072.1 through 1072.N of FIG. 10) may be coupled to $V_{TX}$ at their inputs in step 1142. While $V_{TX}$ is shown by way of example, a different voltage may be used. Step 1142 merely sets an initial voltage for the first operation of the device. In step 1144, half of the TX multiplexors may be coupled to the mutual capacitances of the panel through their respective switches (1074.1 through 1074.N of FIG. 10). After step 1144, current may be placed on the input of channel 1020 according to the size of the mutual capacitances and the value of $V_{TX}$. The ADC may be run again in step 1146, generating a compensated value for the sensor capacitance ($C_S$ from FIG. 3A, $C_F$ and $C_{PX}$ from FIG. 10) with at least a portion of the current from $C_{PX}$ biased out of the input to channel 1020. With no conductive object present on the array, and with the correct voltages and mutual capacitances selected, the output of the analog-to-digital conversion of ADC 1026 is zero in one embodiment. In another embodiment, the output of ADC 1026 may be a mid-scale value or another value that maximizes the dynamic range of ADC 1026 when finger capacitance is applied or removed. While zero may be the desired result of the conversion, a value that is substantially close to zero may be selected. The output of ADC 1026 may be compared to the expected value (zero) in step 1147 and if it is not equal to the expected value, a successive approximation routine (SAR algorithm) may be run in step 1148. In one embodiment, the SAR algorithm of step 1148 may be configured to increase or decrease the number of mutual capacitances coupled to the input of channel 1020. In another embodiment, SAR algorithm may be configured to set the input voltages on multiplexors 1072.1 through 1072.N to a voltage other than $V_{TX}$ (such as $V_{SHIELD}$, $V_{DD}$, or ground), either in whole or in part. In still another embodiment, the SAR algorithm may be configured to change the number of mutual capacitances coupled to the input channel as well as to change the input voltages on multiplexors 1072.1 through 1072.N. Additionally, while a SAR algorithm is described in FIG. 11, one of ordinary skill in the art would recognize that other search and sort algorithms or methods may be employed. For instance, in one embodiment the method of FIG. 11 may run through every potential setting to identify the best configuration. In various embodiments different search algorithms may be used, including a uniform binary search, a dichomtomic search, wherein a selection of two alternatives is chosen at each sub-step of step 1148 (not shown), a nearest neighbor search (NNS; or a proximity search, similarity search, or closest point search), or a Fibonaccci search. Once the output of ADC 1026 is equal to an expected value, the ADC 1026 may be run again in step 1150 to measure the self capacitance of the sensor ($C_S$ of FIG. 3A) such that the digital output of ADC 1026 is representative of the finger capacitance 1010. The changes to the compensation circuit of FIG. 10 may be set in step 1149 and applied before the ADC is re-run in step 1146 unto the ADC output is zero, or other desired value or range.

Figure 12A:
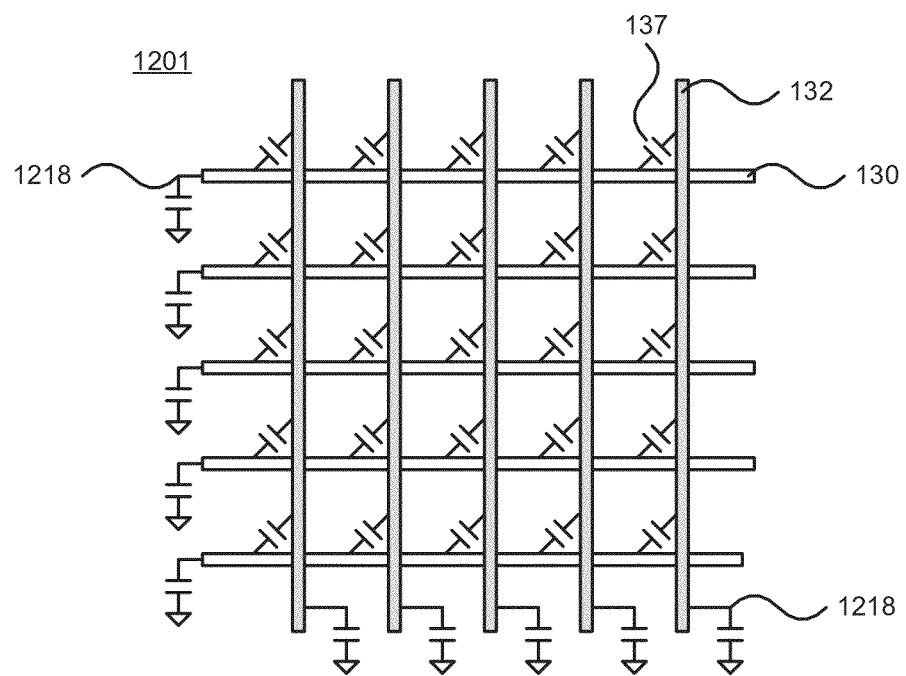
FIG. 12A illustrates a representation of the self capacitances and mutual capacitances on a capacitance sensing array, according to one embodiment.

FIG. 12A illustrates one embodiment of a 5×5 array of capacitance sensors 1201. Five row electrodes 130 are disposed substantially parallel to each other and five column electrodes 132 are disposed substantially parallel to each other and orthogonal to the five row electrodes 130. In another embodiment column electrodes 132 may intersect row electrodes 130 at a non-perpendicular angle. At the intersection of each row and column electrodes there is a mutual capacitance 137 as described in FIG. 1C. While bar electrodes are illustrated in FIG. 12A, this is merely for clarity of demonstration and not intended to be limiting. One of ordinary skill in the art would understand that diamond-shaped electrodes (like those illustrated in FIG. 1B) may be used. Additionally any construction that allows for mutual capacitances at intersections of axes may be used. Each row and column electrodes will also have a panel capacitance 1218 as described above with regard to panel capacitance 1018 of FIG. 10. While row electrodes 130 are illustrated as coupled to a first signal driver ($V_{SHIELD}$) 1225 and column electrodes 132 are illustrated as coupled to second signal driver (or receive channel) 1215, one or ordinary skill in the art would understand that the signal drivers for row electrodes 130 and column electrodes 132 may be reversed, either for the entire panel or for specific rows or columns, according to various embodiments.

Figure 12B:
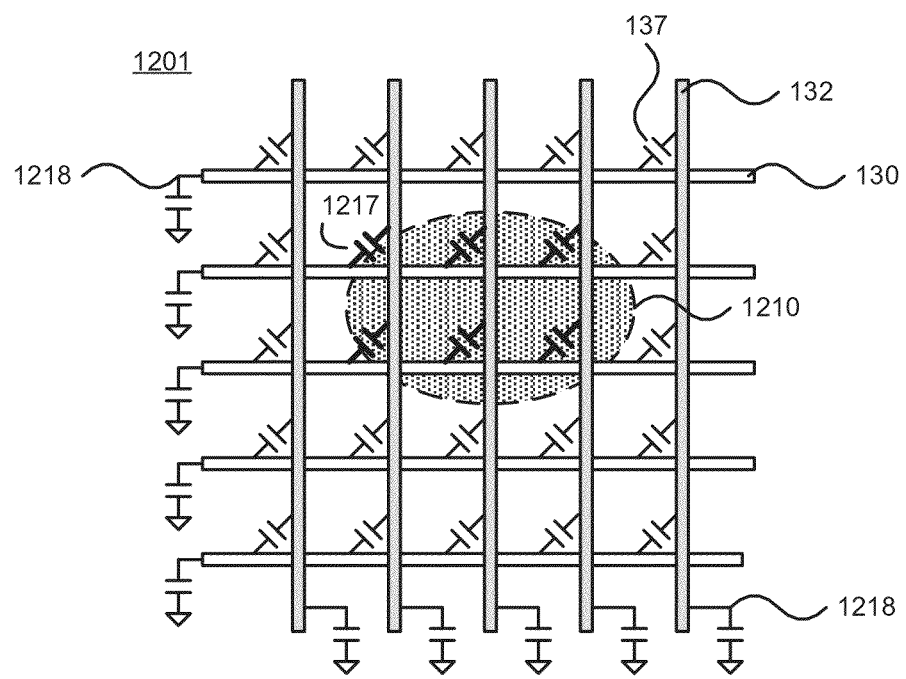
FIG. 12B illustrates a representation of the effect of water on the mutual and self capacitances on a capacitance sensing array, according to one embodiment.

FIG. 12B illustrates the 5×5 array of capacitance sensors 1201 with water 1210 or some other conductive substance disposed across several intersections. The effect of water over an intersection is to change the capacitance 1217 of that intersection and thereby change that mutual capacitances contribution to the hardware baseline scheme described in FIGS. 10 and 11. In FIG. 12B, water 1210 overlaps six intersections, making the mutual capacitance 1217 of those intersection different than it would be without the water present (as shown in FIG. 12A).

Figure 12C:
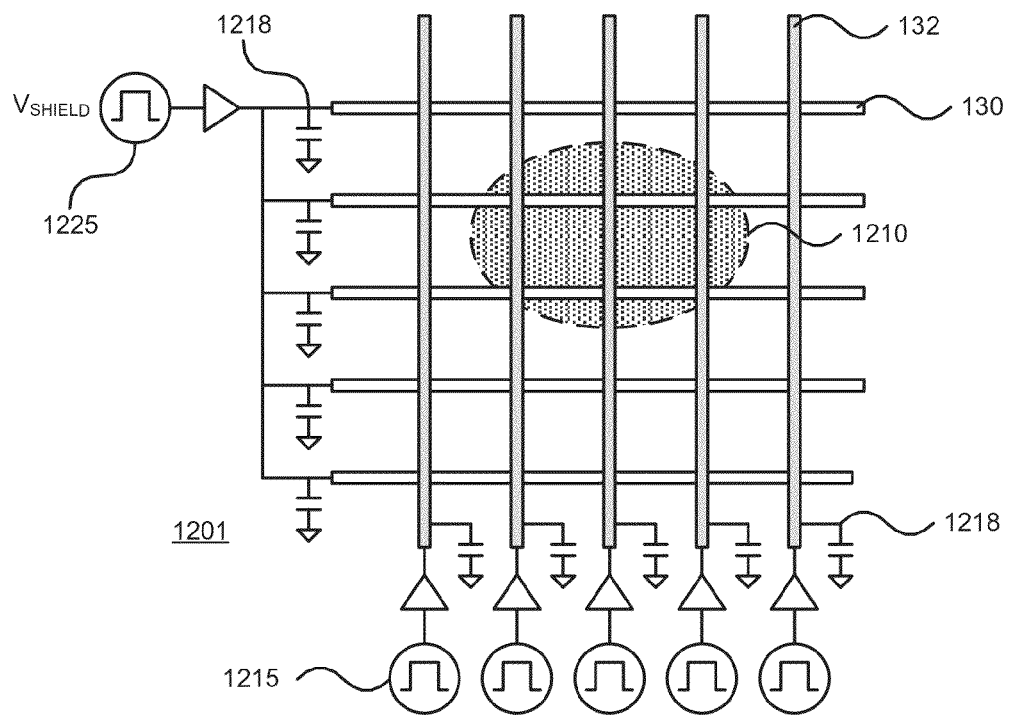
FIG. 12C illustrates a representation of the effect of water on the mutual and self capacitances on a capacitance sensing array with one axis of the capacitance sensing array driven with a shield voltage, according to one embodiment

FIG. 12C illustrates one embodiment for a technique to mitigate the effect of water 1210 on self capacitance measurement of an electrode in a panel. In this embodiment, self capacitance sensors are driven with a drive voltage 1215 to generate a current on the integration circuit (channel 320 of FIG. 3A and channel 1020 of FIG. 10) from the switched network (315 from of FIG. 3A). To eliminate the mutual capacitance that exists at the intersections of the row and column electrodes, the electrodes orthogonal to the electrodes for which the self capacitance is measured may be coupled to a shield voltage 1225 ($V_{SHIELD}$) with is substantially equal to the drive voltage 1215 input to the switched network 315 (of FIG. 3A). Since both sides of the mutual capacitance 137 (FIGS. 1C and 12A) are at the same voltage potential, no charge from the mutual capacitor is input to the channel (320 of FIG. 3A and 1020 of FIG. 10), according to Equation (2). The current that is input to the channel is therefore only the current from the self capacitance 310 of the sensor and the switch network 315. Note, while the capacitances at the intersections are still present, their impact on self capacitance measurement is removed; the symbols for these capacitances are removed from FIG. 12C for clarity of description.

Figure 12D:
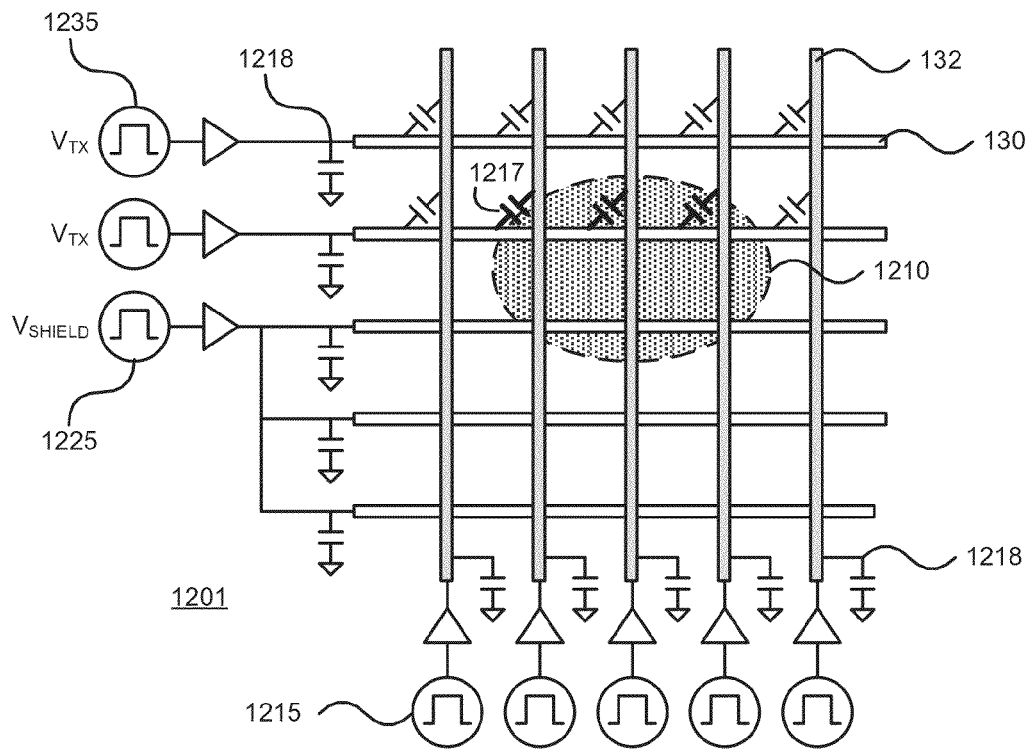
FIG. 12D illustrates a representation of the effect of water on the mutual and self capacitances on a capacitance sensing array with a first portion of one axis of the capacitance sensing array driven with a shield voltage and a second portion of one axis of the capacitance sensing array driven with a voltage that is not the shield voltage, according to one embodiment.

FIG. 12D illustrates one embodiment for a technique to mitigate the effect of water while at the same time providing some hardware baseline compensation as described with regard to FIGS. 10 and 11. At least some of the electrodes that are orthogonal to the self capacitance being measured by channel 320 are driven with shield voltage ($V_{SHIELD}$) 1225. Others of the electrodes that are orthogonal to the self capacitance being measured by channel 320 are driven at a different voltage, in this example $V_{TX}$ 1235. In this embodiment, current from the mutual capacitance at the intersections with $V_{TX}$ 1235 and the drive signal is input to channel 320 (according to Equations (3) and (4)), but it is less than if the whole panel was driven at $V_{TX}$ 1235 or some other voltage not equal to $V_{SHIELD}$ 1225.

The technique of FIG. 12D may then change the electrodes that are driven by $V_{SHIELD}$ and $V_{TX}$ and may drive other electrodes at a different voltage (such as $V_{DD}$ or ground). After a certain number of repetitions of this drive scheme with different configurations of electrodes driven at different voltages, the analog-to-digital conversions (by ADC 326 of FIG. 3A or ADC 1026 of FIG. 10) may be averaged to produce the self capacitance measurement value used for processing (as in steps 920 through 980 of method 901 in FIG. 9).

Figure 13:
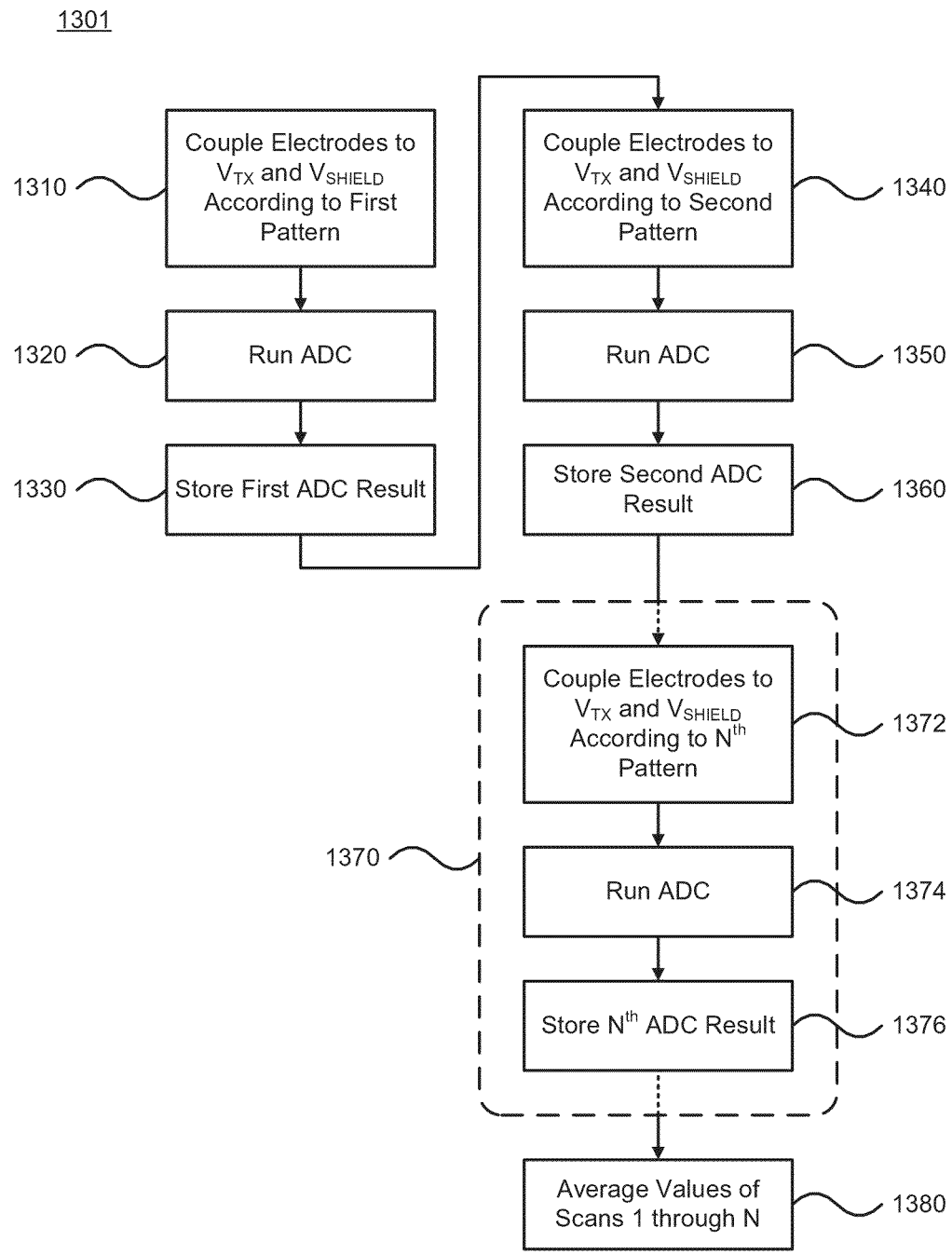
FIG. 13 illustrates a method for baseline compensation and water rejection for self capacitance measurement using the mutual capacitances of the capacitance sensing array, according to one embodiment.

FIG. 13 illustrates a method 1301 for the technique described with regard to FIGS. 12A through 12D. In step 1310, electrodes orthogonal to the self capacitance being measured may be coupled to $V_{TX}$ and $V_{SHIELD}$ according to a first pattern. The ADC may be run for the self capacitance in step 1320 and the value of the first analog-to-digital conversion stored in a memory in step 1330. In step 1340, electrodes orthogonal to the self capacitance being measured may be coupled to $V_{TX}$ and $V_{SHIELD}$ according to a second pattern. The ADC may be run for the self capacitance in step 1350 and the value of the second analog-to-digital conversion stored in a memory in step 1360. This process may be continued as many times as is desired in step 1370, wherein the electrodes orthogonal to the self capacitance being measured may be coupled to $V_{TX}$ and $V_{SHIELD}$ according to a $N^{th}$ pattern in sub-step 1372. The ADC may be run for the self capacitance in sub-step 1374 and the value of the $N^{th}$ analog-to-digital conversion stored in a memory in step 1376. The values of the first through $N^{th}$ ADC operation may then be averaged, or otherwise processed, in step 1380 for each self capacitance to be measured.

Figure 14:
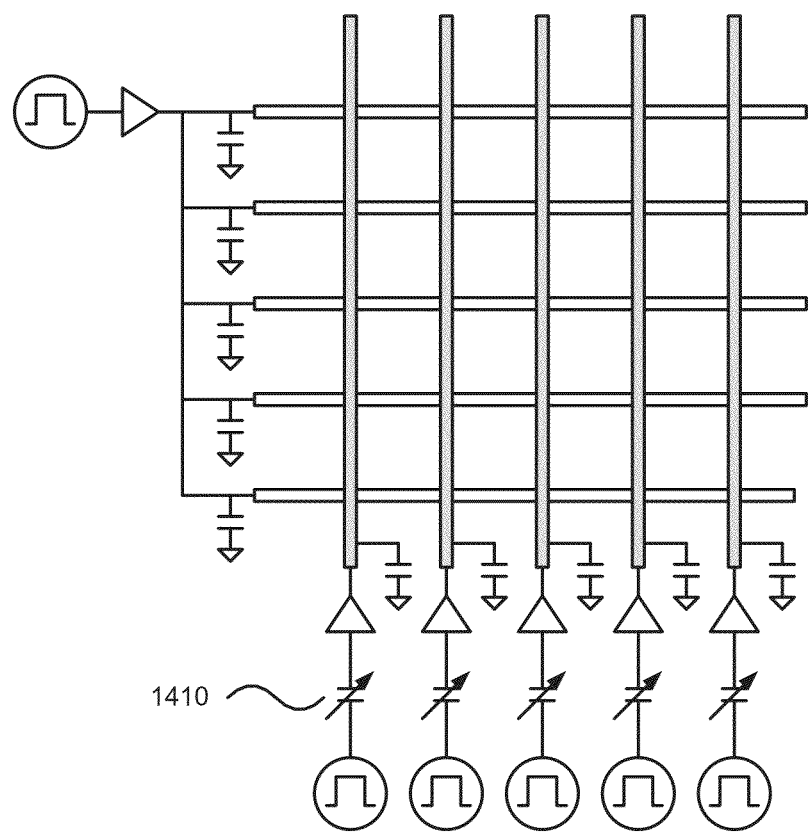
FIG. 14 illustrates a circuit of fine baseline compensation, according to one embodiment.

FIG. 14 illustrates a technique 1401 for one embodiment of mitigating the final mutual capacitance created current on the input of the channel (320 of FIG. 3A and 1020 of FIG. 10) by supplying an additional variable capacitance 1410 on the input of the channel. The variable capacitance may be used to compensate for current from small capacitances that are not balanced out by driving the mutual capacitances of the array (as shown in FIG. 10) or are input to the channel by the presence of water or other conductive materials. The value of the additional variable capacitance 1410 on each self capacitance may be controlled by a CPU (such as CPU 512 of FIG. 5) or may be completed in logic stored in a memory (such as memory 514 of FIG. 5).

While only the column electrodes of FIGS. 12B through 12D and FIG. 14 are illustrated as coupled to the capacitance sensing circuit (such as those shown in FIGS. 3A, 3B, and 10), row electrodes may also be coupled to the capacitance measurement circuitry. In this embodiment, a position on both axes may be determined. When row electrodes are coupled to the capacitance measurement circuitry, the column electrodes may be coupled to the various drive voltages of drive circuit 1070 and a methods similar to those in FIGS. 11 and 13 used to perform baseline compensation and water mitigation for self capacitance sensing of row electrodes.

Figure 15:
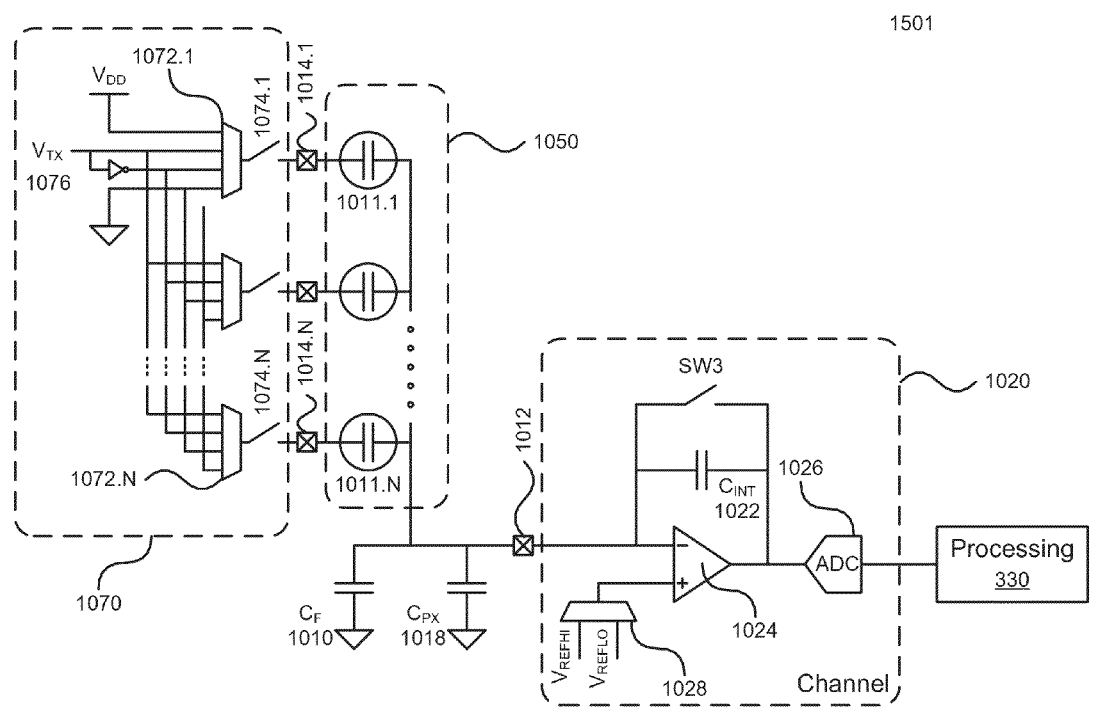
FIG. 15 illustrates a circuit for baseline compensation for self capacitance measurement using the mutual capacitances of the capacitance sensing array with a single drive voltage, according to one embodiment.

FIG. 15 illustrates a hardware baseline circuit 1501 according to one embodiment of the present invention. Hardware baseline circuit 1501 may use only one voltage, $V_{TX}$ 1076, and its compliment as an input to multiplexors 1072.1 through 1072.N, in addition to $V_{DD}$ and ground. This is in contrast to the scheme of FIG. 10 wherein two voltages, $V_{TX}$ 1076 and $V_{SHIELD}$ 1077, are input to multiplexors 1072.1 through 1072.N, in addition to $V_{DD}$ and ground. One of ordinary skill in the art would recognize that the implementation of one additional voltage, or two, or three is not meant to be limiting. The number of voltages that may be input to multiplexors 1072.1 through 1072.N may be limited only by the number of available voltages in the circuit (either on-chip or in-system) and the number of input to multiplexors 1072.1 through 1072.N.

Figure 16:
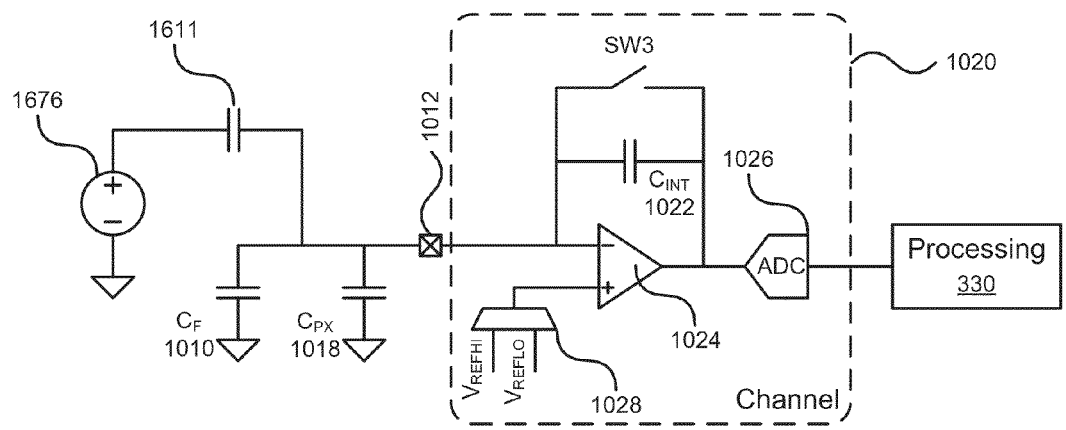
FIG. 16 illustrates a circuit for baseline compensation for self capacitance measurement using a fixed capacitance, according to one embodiment.

FIG. 16 illustrates hardware baseline circuit 1601 according one embodiment of the present invention. Hardware baseline circuit 1601 may use a single fixed capacitance 1611 and a single fixed voltage 1676 on the input of the channel. While this circuit does not provide the precision of the techniques describe in FIGS. 10 and 15, the control circuitry and required switches and burden on the CPU may be greatly reduced.

Figure 17:
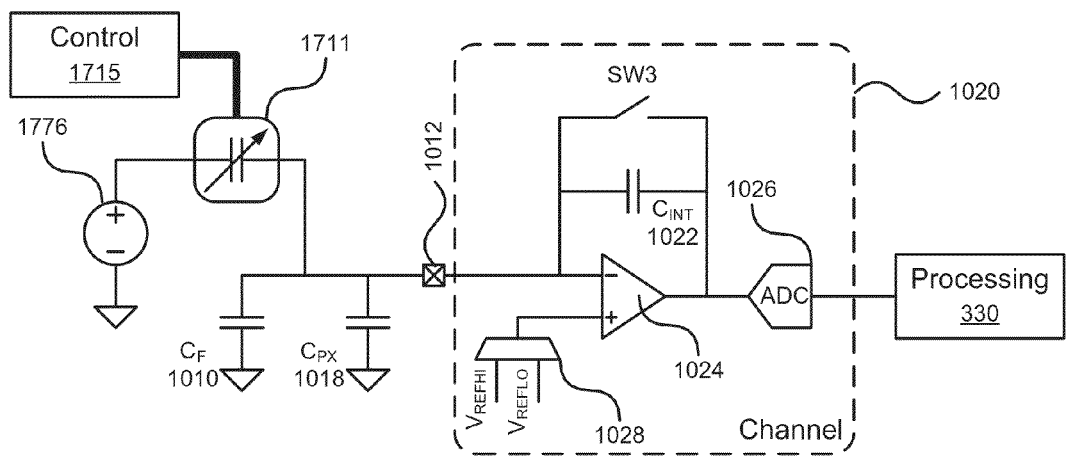
FIG. 17 illustrates a circuit for baseline compensation for self capacitance measurement using a variable capacitance and a control signal, according to one embodiment.

FIG. 17 illustrates of embodiment of hardware baseline circuit 1701 according one embodiment of the present invention. Hardware baseline circuit 1701 may use a single variable capacitance 1711 and a single fixed voltage 1776 on the input of the channel. The variable capacitance may be set by a control circuit 1715 either globally or for each self capacitance measured by the channel. In one embodiment, a SAR algorithm similar to that described with regard to step 1148 of FIG. 11 may be used to set the correct capacitance of the single variable capacitance 1711. Just as with the hardware baseline circuit 1601 of FIG. 16, while this circuit does not provide the precision of the techniques describe in FIGS. 10 and 15, the control circuitry and required switches and burden on the CPU may be greatly reduced.

Figure 18:
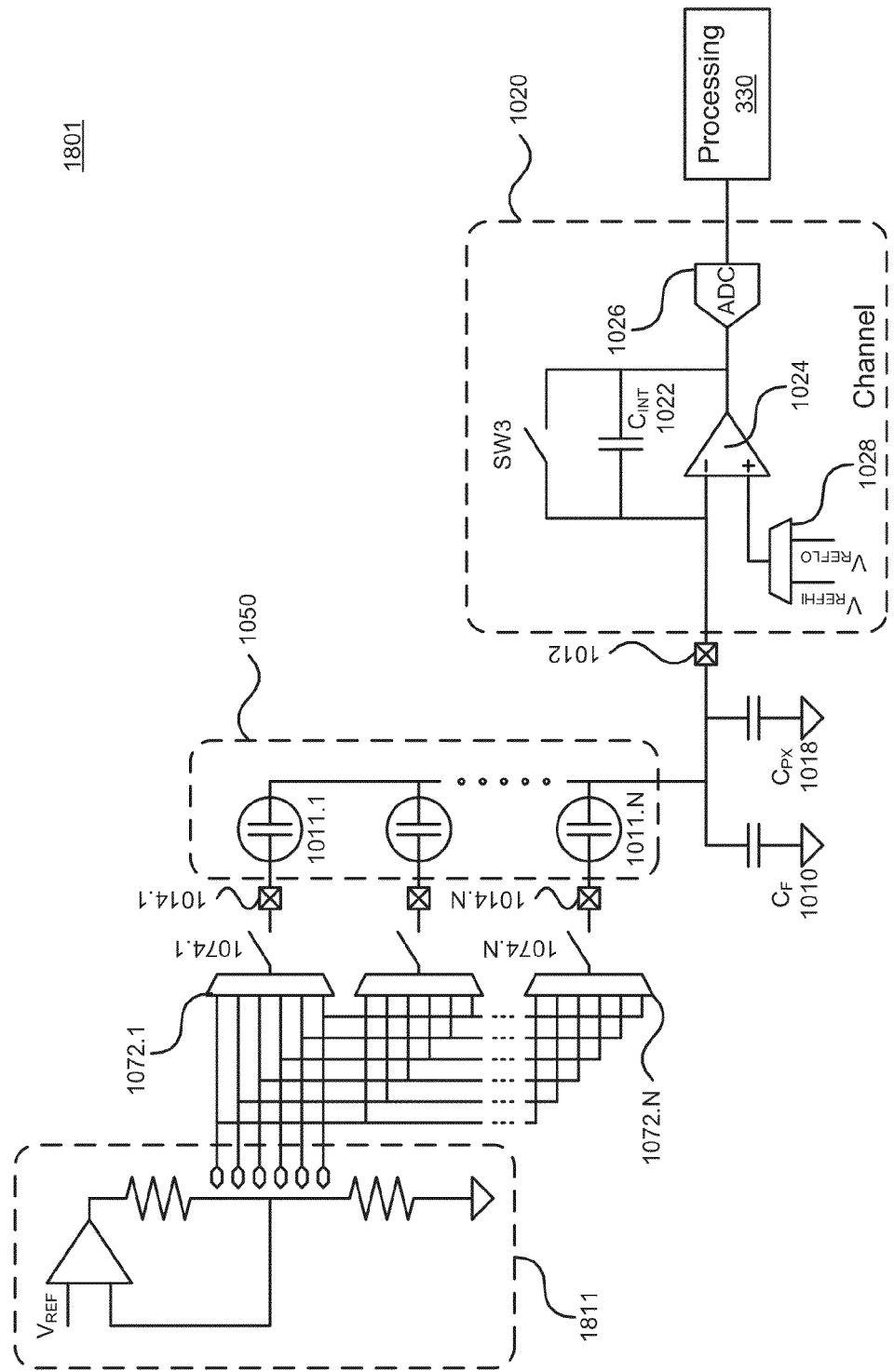
FIG. 18 illustrates a circuit for baseline compensation for self capacitance measurement the mutual capacitances of the capacitance sensing array and a programmable voltage digital-to-analog converter (DAC), according to one embodiment.

FIG. 18 illustrates an embodiment of hardware baseline circuit 1801 according to another embodiment of the present invention. Hardware baseline circuit 1801 may comprise a programmable voltage digital-to-analog converter (DAC) 1811 coupled to the inputs of multiplexors 1072.1 through 1072.N. In this embodiment, the voltages that may be supplied to mutual capacitances 1011.1 through 1011.N and the current from which that is input to the channel may be controlled with a high degree of precision (rather than supplying only one or two or three different voltages).

For simplicity of explanation, the above methods are depicted and described as a series of acts. Although the operations of the methods herein are shown and described in a particular order, such order does not mean that such operations are necessarily performed in that order. Operations in accordance with this disclosure can occur in various orders and/or concurrently, and with other acts not presented and described herein. Certain operations may be performed, at least in part, concurrently with other operations and certain operations may be performed in an inverse order to that shown or described.

The methods described above regarding capacitance to code conversion can be implemented by a channel 1020, which may be implemented in a capacitive touch screen controller. In one embodiment, the capacitive touch screen controller is the TrueTouch® capacitive touchscreen controller, such as the CY8CTMA3xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports operating systems, and is optimized for low-power multi-touch gesture and all-point touchscreen functionality. Alternatively, the touch position calculation features may be implemented in other touch-screen controllers, or other touch controllers of touch-sensing devices. In one embodiment, the touch position calculation features may be implemented with other touch filtering algorithms as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "integrating," "comparing," "balancing," "measuring," "performing," "accumulating," "controlling," "converting," "accumulating," "sampling," "storing," "coupling," "varying," "buffering," "applying," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

The invention claimed is:

1. A capacitance sensing circuit comprising:
    a first plurality of electrodes disposed along a first axis;
    a second plurality of electrodes disposed along a second axis such that a plurality of mutual capacitances are formed between at least one of the first plurality of electrodes and at least one of the second plurality of electrodes, wherein each of the first and second pluralities have a panel capacitance;
    a conversion circuit selectively coupled to the first and second pluralities of electrodes and configured to convert a self capacitance of at least one of the first plurality of electrodes or at least one of the second plurality of electrodes to a digital value; and a compensation circuit configured to produce a compensation signal for the conversion circuit based, in part, on at least one of the plurality of mutual capacitances.

2. The capacitance sensing circuit of claim 1, wherein the compensation circuit comprises:

a plurality of first switches configured to multiplex a plurality of drive voltages onto the second plurality of electrodes;

a plurality of drive voltages, each selectively coupled to an input of each of the first plurality of switches; and a second plurality of switches coupled to an output of each of the first plurality of switches and configured to couple the output of the each of the plurality of switches to one of the first or second pluralities of electrodes.

3. The capacitance sensing circuit of claim 2, wherein the plurality of drive voltages comprises a power supply voltage for the capacitance sensing circuit, a ground potential, and a shield voltage.

4. The capacitance sensing circuit of claim 3, wherein the plurality of drive voltages further comprises a transmit voltage usable as a transmit voltage for a mutual capacitance measurement.

5. The capacitance sensing circuit of claim 2, wherein the plurality of drive voltages are chosen and the plurality of switches are closed based on a successive approximation routine (SAR).

6. The capacitance sensing circuit of claim 1, wherein the compensation signal is configured to reduce the effect of the panel capacitance on an output of the conversion circuit.

7. The capacitance sensing circuit of claim 1, wherein the conversion circuit comprises:

an operational amplifier;

an integration capacitor coupled between an input of the operational amplifier and an output of the operation amplifier; and an analog-to-digital converter (ADC) coupled to the output of the operation amplifier and configured to produce a digital representation of a voltage on the integration capacitor.

8. The capacitance sensing circuit of claim 1, wherein the conversion circuit is selectively coupled to the first plurality of electrodes and the compensation circuit is selectively coupled to the second plurality of electrodes in a first phase, and wherein the conversion circuit is selectively coupled to the second plurality of electrodes and the compensation circuit is selectively coupled to the first plurality of electrodes in a second phase.

9. A method comprising:

converting a self capacitance of at least one of a plurality of first electrodes to a first digital value;

if the first digital value is outside a first expected range, coupling a first compensation capacitance to the self capacitance and converting the self capacitance and the first compensation capacitance to a second digital value;

if the second digital value is outside a second expected range, coupling a second compensation capacitance to the self capacitance and converting the self capacitance and the second compensation capacitance to a third digital value; and if the first digital value is within the first expected range or the second digital value is within the second expected range, processing the first or second digital value to determine if a conductive object is in proximity to at least of the plurality of first electrodes.

10. The method of claim 9, wherein the first and second compensation capacitances comprise at least one mutual capacitance on a capacitance sensing array.

11. The method of claim 10, wherein the mutual capacitance is a capacitance between at least one of the plurality of first electrodes and at least one of a plurality of second electrodes, the second electrodes substantially orthogonal to the first electrodes.

12. The method of claim 9, wherein the second compensation capacitance is determined based on a successive approximation routine (SAR).

13. The method of claim 9, wherein the first and second compensation capacitances are selectively coupled to at least one of a plurality of drive voltages, the first and second compensation capacitances and the drive voltages configured to provide a compensation signal for the conversion of the self capacitance.

14. The method of claim 9, wherein the first and second compensation capacitances are defined by a combination of mutual capacitances of a capacitance sensing array.

15. The method of claim 9, wherein converting and compensating are completed for each of the plurality of first electrodes.

16. The method of claim 15, wherein the converting and compensating are completed for each of a plurality of second electrodes, the second electrodes substantially orthogonal to the first electrodes.

17. A method comprising:

coupling at least one of a first subset of a first plurality of electrodes to first voltage potential;

coupling at least one of a second subset of the first plurality of electrodes to a second voltage potential, wherein the first plurality of electrodes form a mutual capacitance with a second plurality of electrodes;

converting a self capacitance of at least one of the second plurality of electrodes to a first digital value, wherein the digital value is a product of the self capacitance and a signal from the first and second subsets of the first plurality of electrodes and the first and second voltage potentials;

coupling at least one of a third subset of the first plurality of electrodes to first voltage potential;

coupling at least one of a fourth subset of the first plurality of electrodes to a second voltage potential;

converting a self capacitance of at least one of the second plurality of electrodes to a second digital value, wherein the digital value is a product of the self capacitance and a signal from the third and fourth subsets of the first plurality of electrodes and the first and second voltage potentials; and combining the first and second digital values.

18. The method of claim 17, wherein the first and second digital values are further a product of a variable capacitance coupled to at least one of the second plurality of electrodes.

19. The method of claim 17, wherein the first, second, third, and fourth subsets of the first plurality of electrodes are configured to distribute the first and second voltage potentials across the first plurality of electrodes.

20. The method of claim 17, wherein the first voltage potential is a shield voltage and the second voltage potential is a transmit voltage for a mutual capacitance conversion circuit.

* * * * *